(12) United States Patent
Lee et al.

(10) Patent No.: US 10,553,434 B2
(45) Date of Patent: Feb. 4, 2020

(54) METHODS FOR MANUFACTURING SEMICONDUCTOR DEVICES

(71) Applicant: Samsung Electronics Co., Ltd., Suwon-si, Gyeonggi-do (KR)

(72) Inventors: Jung Han Lee, Anyang-si (KR); Byoung-gi Kim, Suwon-si (KR); Jong Pil Kim, Seoul (KR); Kihwan Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/027,692

(22) Filed: Jul. 5, 2018

(65) Prior Publication Data

US 2019/0198323 A1 Jun. 27, 2019

(30) Foreign Application Priority Data

Dec. 21, 2017 (KR) .......................... 10-2017-0177169

(51) Int. Cl.
| | | |
|---|---|---|
| *H01L 21/225* | (2006.01) | |
| *H01L 21/02* | (2006.01) | |
| *H01L 21/8238* | (2006.01) | |
| *H01L 23/532* | (2006.01) | |
| *H01L 21/762* | (2006.01) | |

(52) U.S. Cl.
CPC .... *H01L 21/2253* (2013.01); *H01L 21/02381* (2013.01); *H01L 21/02694* (2013.01); *H01L 21/762* (2013.01); *H01L 21/823814* (2013.01); *H01L 21/823892* (2013.01); *H01L 23/5329* (2013.01)

(58) Field of Classification Search
CPC ......... H01L 21/2253; H01L 21/823892; H01L 21/02694; H01L 21/762; H01L 21/823814; H01L 21/02381; H01L 23/5329
See application file for complete search history.

(56) References Cited

U.S. PATENT DOCUMENTS

| | | | |
|---|---|---|---|
| 8,278,179 B2 | 10/2012 | Lin | |
| 8,889,494 B2 | 11/2014 | Toh | |
| 9,093,565 B2 | 7/2015 | Wang | |
| 9,640,663 B2 | 5/2017 | Chen | |
| 9,761,723 B2 | 9/2017 | Ching | |
| 2017/0062280 A1 | 3/2017 | Li | |
| 2017/0062564 A1* | 3/2017 | Zhou | ................... H01L 29/0684 |
| 2017/0154827 A1 | 6/2017 | Zhou | |
| 2017/0154996 A1 | 6/2017 | Lin | |
| 2017/0186654 A1 | 6/2017 | Li | |
| 2017/0250183 A1 | 8/2017 | Brunco | |

FOREIGN PATENT DOCUMENTS

| | | |
|---|---|---|
| KR | 20100001870 | 1/2010 |
| KR | 101128915 | 3/2012 |

* cited by examiner

*Primary Examiner* — Karen Kusumakar
(74) *Attorney, Agent, or Firm* — Myers Bigel, P.A.

(57) ABSTRACT

A method for manufacturing a semiconductor device includes performing a first ion implantation process on a substrate to form a lower dopant region in the substrate, patterning the substrate having the lower dopant region to form active patterns, and performing a second ion implantation process on the active patterns to form an upper dopant region in an upper portion of each of the active patterns. The lower and upper dopant regions have a same conductivity type.

20 Claims, 43 Drawing Sheets

METHODS FOR MANUFACTURING SEMICONDUCTOR DEVICES

CROSS-REFERENCE TO RELATED APPLICATION

This U.S. non-provisional patent application claims priority under 35 U.S.C. § 119 to Korean Patent Application No. 10-2017-0177169, filed on Dec. 21, 2017, in the Korean Intellectual Property Office, the entire content of which is incorporated herein by reference.

BACKGROUND

Embodiments of the inventive concepts relate to method for manufacturing semiconductor devices and, more particularly, to methods for manufacturing semiconductor devices including a field effect transistor.

Semiconductor devices are widely used in the electronic industry because of their small size, multi-functional characteristics, and/or low manufacturing costs. Examples of semiconductor devices include semiconductor memory devices storing logical data, semiconductor logic devices processing logical data, and hybrid semiconductor devices having both the function of the semiconductor memory devices and the function of the semiconductor logic devices. As the electronic industry has developed, semiconductor devices with excellent characteristics have been increasingly demanded. For example, high-reliability, high-speed, and/or multi-functional semiconductor devices have been increasingly demanded. To satisfy these demands, semiconductor devices have been highly integrated and structures of semiconductor devices have become more and more complicated.

SUMMARY

Embodiments of the inventive concepts may provide a method for manufacturing a semiconductor device that is capable of preventing a process fault and/or improving electrical characteristics of the semiconductor device.

In an aspect of the inventive concepts, a method for manufacturing a semiconductor device may include performing a first ion implantation process on a substrate to form a lower dopant region in the substrate, patterning the substrate having the lower dopant region to form active patterns, and performing a second ion implantation process on the active patterns to form an upper dopant region in an upper portion of each of the active patterns. The lower and upper dopant regions may have a same conductivity type.

In an aspect of the inventive concepts, a method for manufacturing a semiconductor device may include performing a first ion implantation process on a substrate, forming mask patterns on the substrate on, etching the substrate using the mask patterns as etch masks to form trenches, forming a device isolation layer in the trenches, and performing a second ion implantation process on the substrate. The first ion implantation process may be performed at a higher power than the second ion implantation process.

In an aspect of the inventive concepts, a method for manufacturing a semiconductor device may include forming a first lower dopant region in a first region of a substrate, patterning the first region having the first lower dopant region to form first active patterns, forming a first upper dopant region in an upper portion of respective ones of the first active patterns, and forming a first source/drain pattern in the upper portion of respective ones of the first active patterns. A conductivity type of the first source/drain pattern may be different from a conductivity type of the first upper dopant region.

BRIEF DESCRIPTION OF THE DRAWINGS

The inventive concepts will become more apparent in view of the attached drawings and accompanying detailed description.

DETAILED DESCRIPTION

Figure 1:
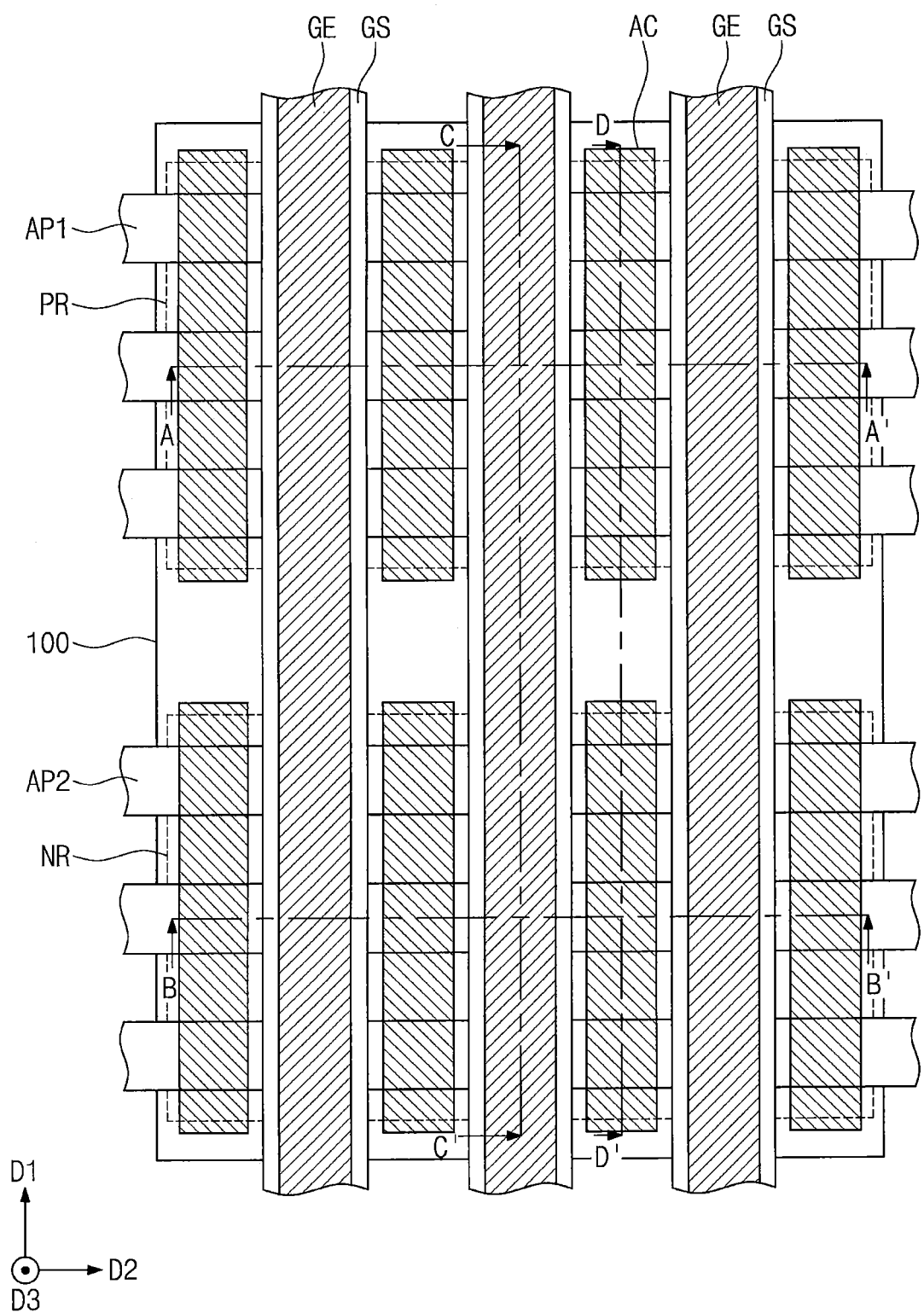
FIG. 1 is a plan view illustrating a semiconductor device according to some embodiments of the inventive concepts.
Figure 2A:
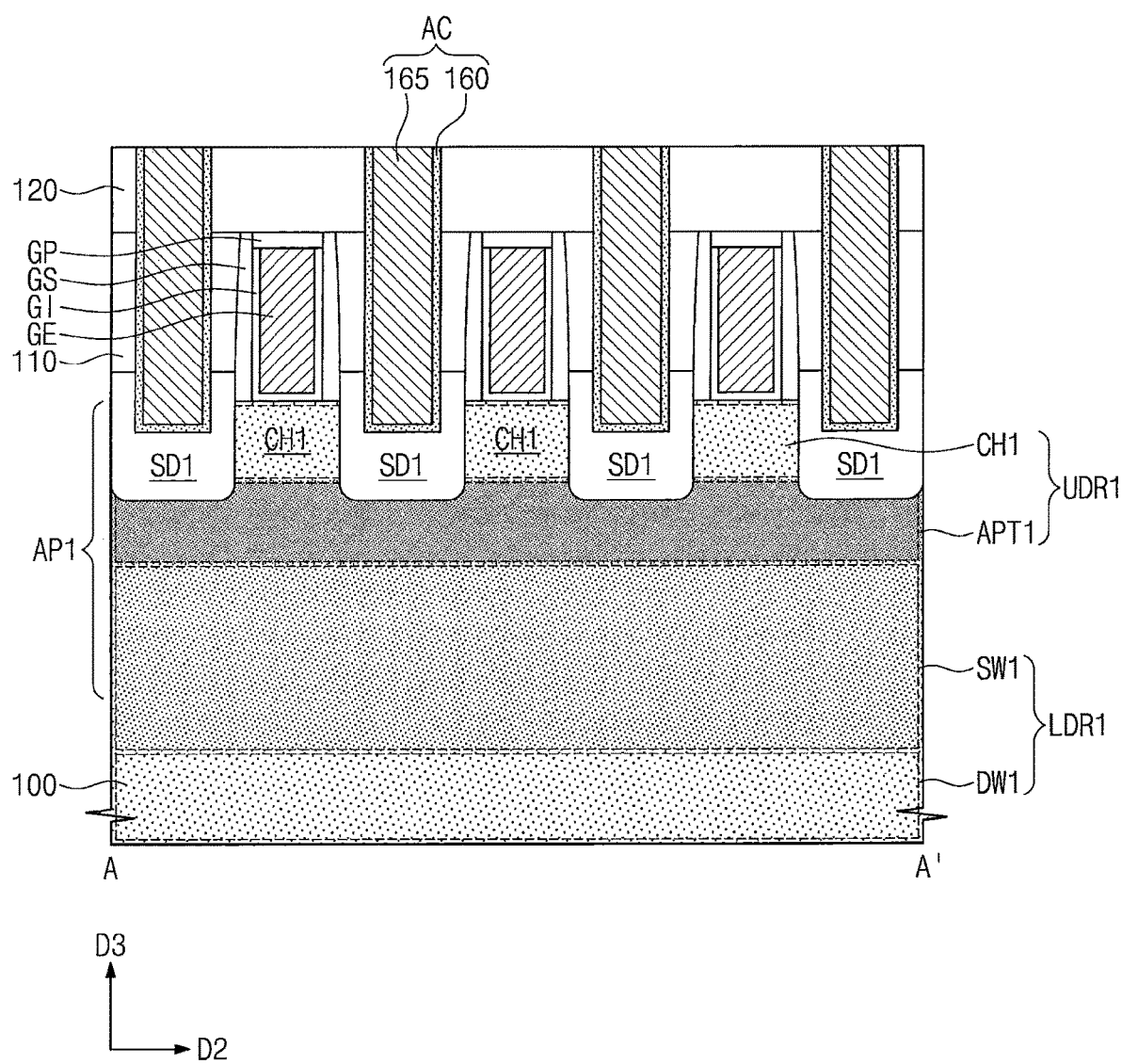
FIGS. 2A, 2B, 2C and 2D are cross-sectional views taken along lines A-A', B-B', C-C' and D-D' of FIG. 1, respectively.
Figure 2B:
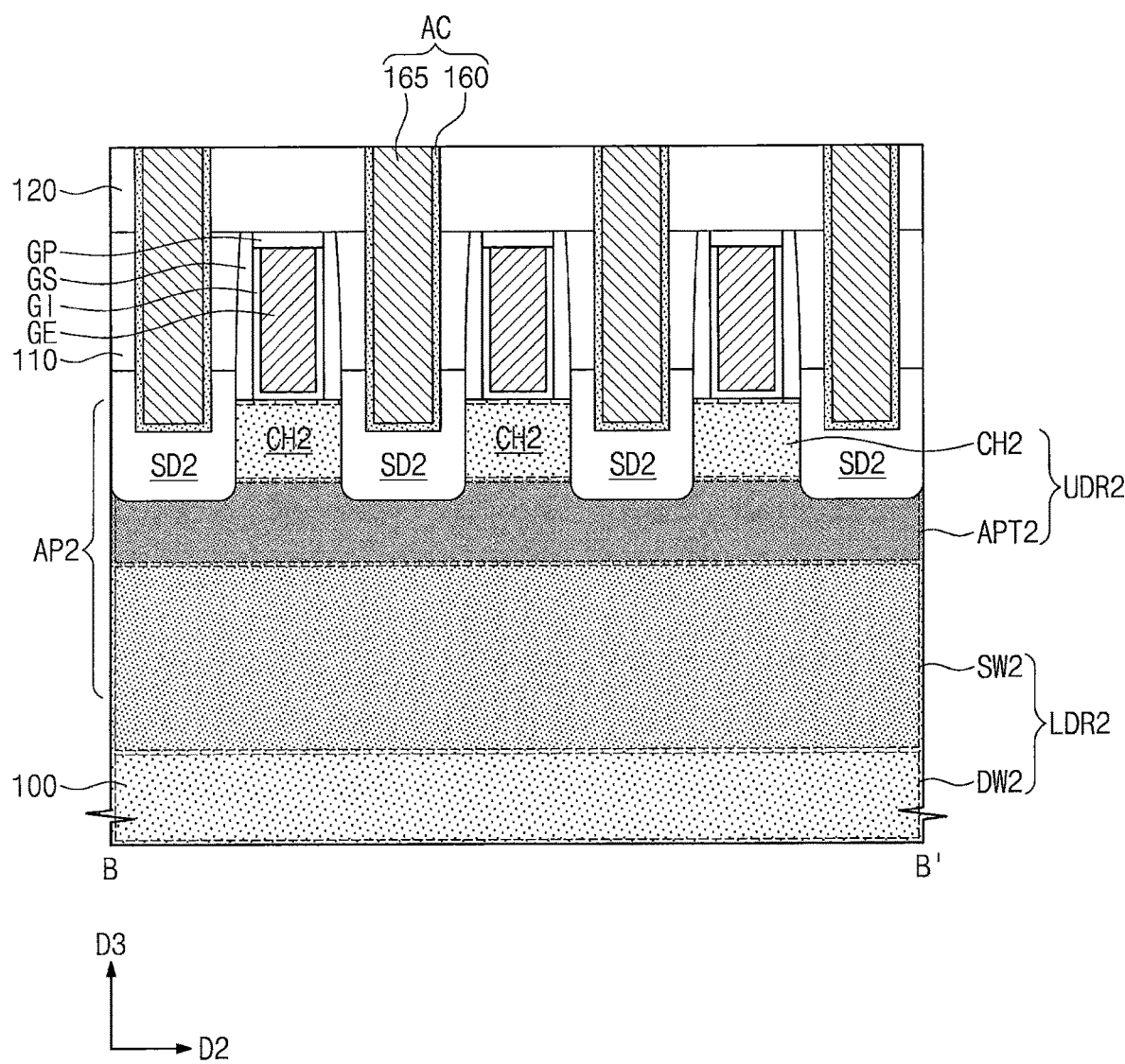
Figure 2C:
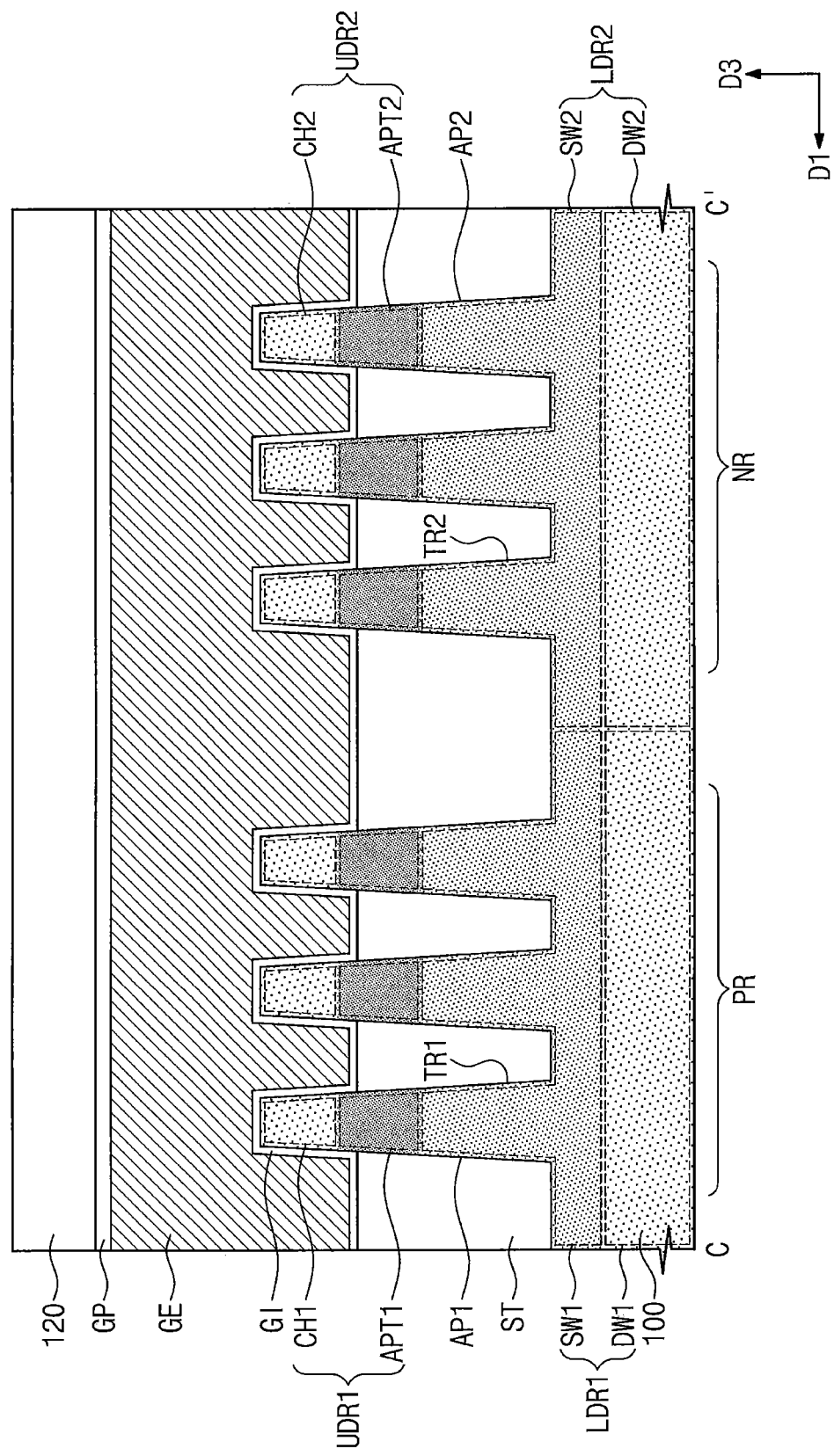
Figure 2D:
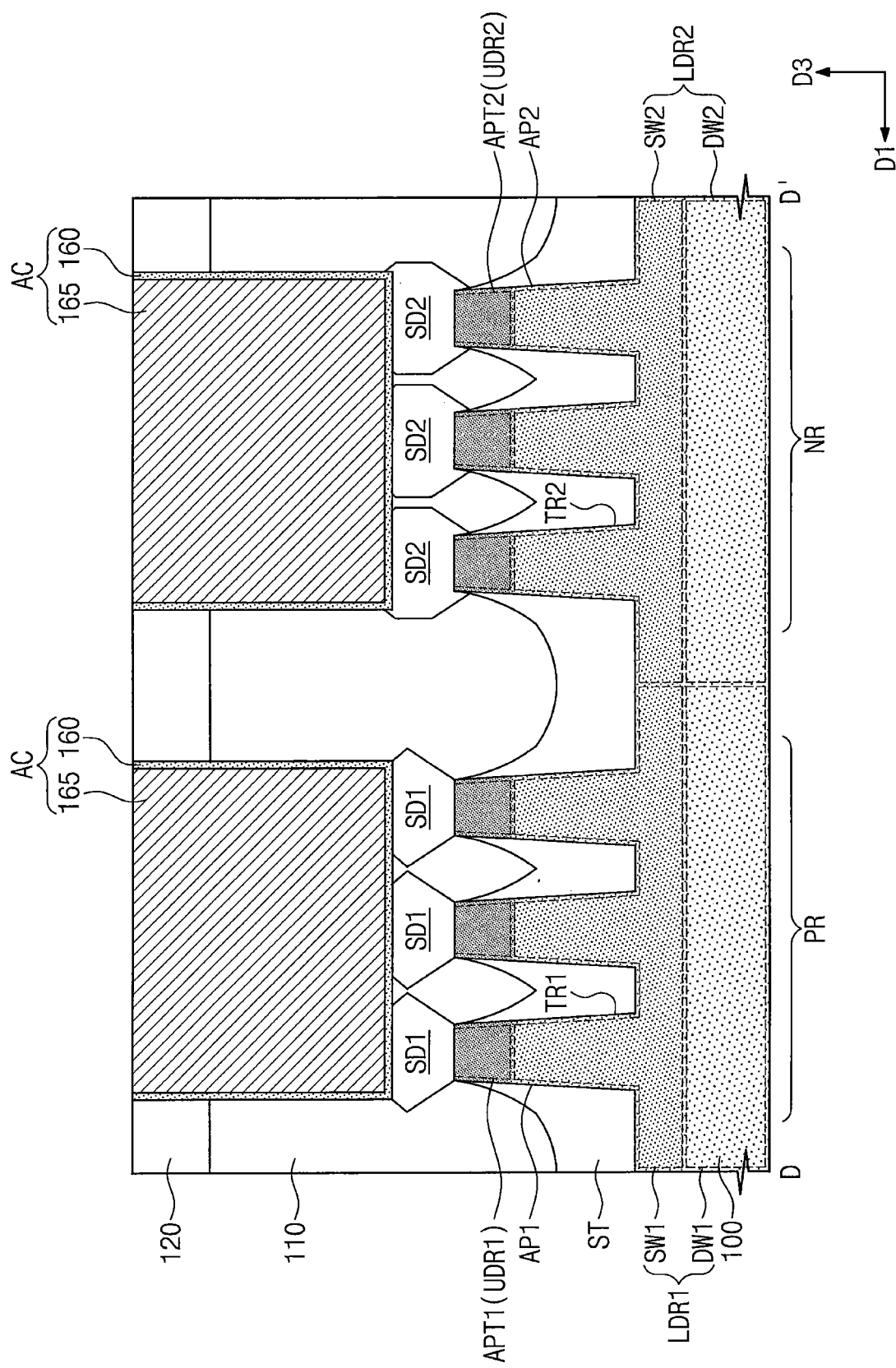

FIG. 1 is a plan view illustrating a semiconductor device according to some embodiments of the inventive concepts. FIGS. 2A, 2B, 2C and 2D are cross-sectional views taken along lines A-A', B-B', C-C' and D-D' of FIG. 1, respectively.

Referring to FIGS. 1 and 2A to 2D, a device isolation layer ST may be provided on a substrate 100. The device isolation layer ST may define a PMOSFET region PR and an NMOSFET region NR. The substrate 100 may be a semiconductor substrate including silicon, germanium, or silicon-germanium or may be a compound semiconductor substrate. In some embodiments, the substrate 100 may be a silicon substrate. The device isolation layer ST may include an insulating material such as a silicon oxide layer.

The PMOSFET region PR and the NMOSFET region NR may be spaced apart from each other in a first direction D1 with the device isolation layer ST interposed therebetween. The first direction D1 may be parallel to a top surface of the substrate 100. The PMOSFET region PR and the NMOSFET region NR may extend in a second direction D2 intersecting the first direction D1. Even though not shown in the drawings, the device isolation layer ST between the PMOSFET region PR and the NMOSFET region NR may be deeper than the device isolation layer ST between active patterns AP1 and AP2 to be described later.

In some embodiments, the PMOSFET region PR and the NMOSFET region NR may be a logic cell region on which logic transistors constituting a logic circuit of a semiconductor device are disposed. For example, the logic transistors constituting a processor core or an input/output (I/O) terminal may be disposed on the logic cell region of the substrate 100. The PMOSFET region PR and the NMOSFET region NR may include some of the logic transistors.

In certain embodiments, the PMOSFET region PR and the NMOSFET region NR may constitute a memory cell region for storing logical data. For example, memory cell transistors constituting a plurality of static random access memory (SRAM) cells may be disposed on the memory cell region of the substrate 100. The PMOSFET region PR and the NMOSFET region NR may include some of the memory cell transistors. However, embodiments of the inventive concepts are not limited thereto.

A plurality of first active patterns AP1 extending in the second direction D2 may be provided on the PMOSFET region PR and a plurality of second active patterns AP2 extending in the second direction D2 may be provided on the NMOSFET region NR. The first and second active patterns AP1 and AP2 may be portions of the substrate 100, which protrude from the top surface of the substrate 100 (e.g., protruding in a third direction D3 that intersects the first direction D1 and the second direction D2). The first and second active patterns AP1 and AP2 may be arranged along the first direction D1.

A first trench TR1 may be defined between the first active patterns AP1 adjacent to each other, and a second trench TR2 may be defined between the second active patterns AP2 adjacent to each other. The device isolation layer ST may be within (e.g., fill) the first and second trenches TR1 and TR2. The device isolation layer ST may define the first and second active patterns AP1 and AP2. The device isolation layer ST may be on (e.g., cover) sidewalls of lower portions of the first and second active patterns AP1 and AP2. In some embodiments, the device isolation layer ST may directly contact the sidewalls of the lower portions of the first and second active patterns AP1 and AP2. Three first active patterns AP1 are illustrated on the PMOSFET region PR and three second active patterns AP2 are illustrated on the NMOSFET region NR. However, embodiments of the inventive concepts are not limited thereto.

Upper portions of the first and second active patterns AP1 and AP2 may be higher than a top surface of the device isolation layer ST. The upper portions of the first and second active patterns AP1 and AP2 may vertically protrude from the device isolation layer ST. The upper portions of the first and second active patterns AP1 and AP2 may have fin-shapes protruding from the device isolation layer ST (e.g., protruding in the third direction D3).

The PMOSFET region PR may include a first lower dopant region LDR1 and a first upper dopant region UDR1 on the first lower dopant region LDR1. The first lower dopant region LDR1 may include a first deep well region DW1 and a first shallow well region SW1 on the first deep well region DW1 (e.g., sequentially stacked). The first upper dopant region UDR1 may include a first anti-punch through region APT1 and a first channel region CH1 on the first anti-punch through region APT1 (e.g., sequentially stacked).

The first deep well region DW1 may be provided in the substrate 100 under the first active patterns AP1. The first shallow well region SW1 may extend from the first deep well region DW1 into a lower portion of each of the first active patterns AP1. The first anti-punch through region APT1 may extend from the first shallow well region SW1 into an upper portion of each of the first active patterns AP1. An upper portion of the first anti-punch through region APT1 may be higher than the top surface of the device isolation layer ST (see FIG. 2C). The first anti-punch through region APT1 may prevent and/or reduce a punch-through phenomenon between the lower portion of each of the first active patterns AP1 and the upper portion of each of the first active patterns AP1.

The first deep well region DW1, the first shallow well region SW1, the first anti-punch through region APT1, and the first channel region CH1 may be dopant regions having a first conductivity type (e.g., an N-type). Each of the first deep well region DW1, the first shallow well region SW1, the first anti-punch through region APT1, and the first channel region CH1 may be independently doped with dopants such as phosphorus (P), antimony (Sb) and/or arsenic (As).

A concentration of the dopants of the first shallow well region SW1 may be higher than a concentration of the dopants of the first deep well region DW1. A concentration of the dopants of the first anti-punch through region APT1 may be higher than a concentration of the dopants of the first channel region CH1. The concentration of the dopants of the first anti-punch through region APT1 may be substantially equal to or higher than the concentration of the dopants of the first shallow well region SW1. The concentration of the dopants may increase from the first channel region CH1, may have a maximum value in the first anti-punch through region APT1 and may decrease toward a lower portion of the first deep well region DW1.

In detail, the concentration of the dopants of the first deep well region DW1 may range from $1.00\ E15/cm^3$ to $2.00\ E18/cm^3$, the concentrations of the dopants of the first shallow well region SW1 may range from $5.00\ E17/cm^3$ to $5.00\ E18/cm^3$, the concentrations of the dopants of the first anti-punch through region APT1 may range from $1.00\ E18/cm^3$ to $1.00\ E19/cm^3$, and the concentration of the dopants of the first channel region CH1 may range from $1.00\ E15/cm^3$ to $3.00\ E18/cm^3$. In some embodiments, the doping profile within the first deep well region DW1, the first shallow well region SW1, the first anti-punch through region APT1, and the first channel region CH1 may be non-uniform.

Though the first deep well region DW1, the first shallow well region SW1, the first anti-punch through region APT1, and the first channel region CH1 are illustrated as contacting one another in FIGS. 2A-2D, the present inventive concepts are not limited thereto. In some embodiments, one or more layers may be interposed therebetween.

The NMOSFET region NR may include a second lower dopant region LDR2 and a second upper dopant region UDR2 on the second lower dopant region LDR2. The second lower dopant region LDR2 may include a second deep well region DW2 and a second shallow well region SW2 on the second deep well region DW2. The second upper dopant region UDR2 may include a second anti-punch through region APT2 and a second channel region CH2 on the second anti-punch through region APT2.

The second deep well region DW2, the second shallow well region SW2, the second anti-punch through region APT2, and the second channel region CH2 may be disposed at substantially the same levels as the first deep well region DW1, the first shallow well region SW1, the first anti-punch through region APT1, and the first channel region CH1, respectively. The second anti-punch through region APT2 may prevent and/or reduce a punch-through phenomenon between a lower portion of each of the second active patterns AP2 and an upper portion of each of the second active patterns AP2.

The second deep well region DW2, the second shallow well region SW2, the second anti-punch through region APT2, and the second channel region CH2 may be dopant regions having a second conductivity type (e.g., a P-type). Each of the second deep well region DW2, the second shallow well region SW2, the second anti-punch through region APT2, and the second channel region CH2 may be independently doped with dopants such as boron (B), gallium (Ga) and/or indium (In).

A concentration of the dopants of the second shallow well region SW2 may be higher than a concentration of the dopants of the second deep well region DW2. A concentration of the dopants of the second anti-punch through region APT2 may be higher than a concentration of the dopants of the second channel region CH2. The concentration of the dopants of the second anti-punch through region APT2 may be substantially equal to or higher than the concentration of the dopants of the second shallow well region SW2. The concentration of the dopants may increase from the second channel region CH2, may have a maximum value in the second anti-punch through region APT2 and may decrease toward a lower portion of the second deep well region DW2.

In detail, the concentration of the dopants of the second deep well region DW2 may range from $1.00\,E15/cm^3$ to $2.00\,E18/cm^3$, the concentrations of the dopants of the second shallow well region SW2 may range from $5.00\,E17/cm^3$ to $5.00\,E18/cm^3$, the concentrations of the dopants of the second anti-punch through region APT2 may range from $1.00\,E18/cm^3$ to $1.00\,E19/cm^3$, and the concentration of the dopants of the second channel region CH2 may range from $1.00\,E15/cm^3$ to $3.00\,E18/cm^3$. In some embodiments, the doping profile within the second deep well region DW2, the second shallow well region SW2, the second anti-punch through region APT2, and the second channel region CH2 may be non-uniform.

Though the second deep well region DW2, the second shallow well region SW2, the second anti-punch through region APT2, and the second channel region CH2 are illustrated as contacting one another in FIGS. 2A-2D, the present inventive concepts are not limited thereto. In some embodiments, one or more layers may be interposed therebetween.

First source/drain patterns SD1 may be provided in upper portions of the first active patterns AP1. The first source/drain patterns SD1 may be dopant regions having the second conductivity type (e.g., the P-type). The first channel region CH1 may be disposed between a pair of the first source/drain patterns SD1. Second source/drain patterns SD2 may be provided in upper portions of the second active patterns AP2. The second source/drain patterns SD2 may be dopant regions having the first conductivity type (e.g., the N-type). The second channel region CH2 may be disposed between a pair of the second source/drain patterns SD2.

The first and second source/drain patterns SD1 and SD2 may include epitaxial patterns formed by a selective epitaxial growth (SEG) process. Top surfaces of the first and second source/drain patterns SD1 and SD2 may be disposed at a higher level than top surfaces of the first and second channel regions CH1 and CH2. In some embodiments, the first source/drain patterns SD1 may include a semiconductor material (e.g., SiGe) of which a lattice constant is greater than that of the semiconductor element of the substrate 100. Thus, the first source/drain patterns SD1 may provide compressive stress to the first channel regions CH1. For example, the second source/drain patterns SD2 may include the same semiconductor element (e.g., silicon) as the substrate 100. For another example, the second source/drain patterns SD2 may include a semiconductor material (e.g., SiC) of which a lattice constant is smaller than that of the semiconductor element of the substrate 100. Thus, the second source/drain patterns SD2 may provide tensile stress to the second channel regions CH2. The anti-punch through regions (e.g., APT1 and/or APT2) may minimize and/or reduce interaction between the source/drain patterns (e.g., SD1 and/or SD2) and the channel regions (e.g., CH1 and/or CH2).

Gate electrodes GE may extend in the first direction D1 to intersect the first and second active patterns AP1 and AP2. The gate electrodes GE may be spaced apart from each other in the second direction D2. The gate electrodes GE may vertically overlap with the first and second channel regions CH1 and CH2. Respective ones of the gate electrodes GE may be on, and in some embodiments surround, a top surface and both sidewalls of one or more of the first and second channel regions CH1 and CH2 (see FIG. 2C). For example, the gate electrodes GE may include at least one of a conductive metal nitride (e.g., titanium nitride or tantalum nitride) or a metal material (e.g., titanium, tantalum, tungsten, copper, or aluminum).

A pair of gate spacers GS may be disposed on both sidewalls of the gate electrodes GE, respectively. The gate spacers GS may extend along the gate electrodes GE in the first direction D1. Top surfaces of the gate spacers GS may be higher than top surfaces of the gate electrodes GE. The top surfaces of the gate spacers GS may be substantially coplanar with a top surface of a first interlayer insulating layer 110 to be described later. The gate spacers GS may include at least one of SiCN, SiCON, or SiN. In certain embodiments, each of the gate spacers GS may have a multi-layered structure formed of at least two of SiCN, SiCON, or SiN.

Gate dielectric patterns GI may be disposed between the gate electrodes GE and the active patterns AP1 and AP2. Respective ones of the gate dielectric patterns GI may extend along a bottom surface and/or both sidewalls of respective ones of the gate electrodes GE. Respective ones of the gate dielectric patterns GI may be on the top surface and both sidewalls of some of the first and second channel regions CH1 and CH2. The gate dielectric patterns GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate capping pattern GP may be provided on each of the gate electrodes GE. The gate capping patterns GP may extend along the gate electrodes GE in the first direction D1. The gate capping patterns GP may include a material having an etch selectivity with respect to first and second interlayer insulating layers 110 and 120 to be described later. For example, the gate capping patterns GP may include at least one of SiON, SiCN, SiCON, or SiN.

A first interlayer insulating layer 110 may be provided on the substrate 100. The first interlayer insulating layer 110 may be on and, in some embodiments, cover the gate spacers GS and the first and second source/drain patterns SD1 and SD2. The top surface of the first interlayer insulating layer 110 may be substantially coplanar with the top surfaces of the gate capping patterns GP and the top surfaces of the gate spacers GS. A second interlayer insulating layer 120 may be disposed on the first interlayer insulating layer 110 and the gate capping patterns GP. For example, each of the first and second interlayer insulating layers 110 and 120 may include a silicon oxide layer.

At least one contact AC may penetrate the second and first interlayer insulating layers 120 and 110 between a pair of the gate electrodes GE so as to be electrically connected to the first and/or second source/drain patterns SD1 and/or SD2. In some embodiments, each of the contacts AC may be connected to a plurality of the source/drain patterns SD1 and/or SD2. In certain embodiments, even though not shown in the drawings, one contact AC may be connected to one source/drain pattern SD1 or SD2. However, embodiments of the inventive concepts are not limited thereto.

Each of the contacts AC may include a conductive pillar 165 and a barrier layer 160 on, and in some embodiments surrounding, the conductive pillar 165. The barrier layer 160 may be on (e.g. covering) sidewalls and on (e.g., covering) a bottom surface of the conductive pillar 165. For example, the conductive pillar 165 may include at least one selected from metal materials such as aluminum, copper, tungsten, molybdenum, and cobalt. The barrier layer 160 may include a metal layer and/or a metal nitride layer. The metal layer may include, for example, at least one of titanium, tantalum, tungsten, nickel, cobalt, or platinum. The metal nitride layer may include, for example, at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

Silicide layers (not shown) may be disposed between the contacts AC and the first and second source/drain patterns SD1 and SD2. The contacts AC may be electrically connected to the first and second source/drain patterns SD1 and SD2 through the silicide layers. The silicide layers may include, for example, a metal silicide and may include at least one of, for example, titanium silicide, tantalum silicide, tungsten silicide, nickel silicide, or a cobalt silicide.

Figure 10A:
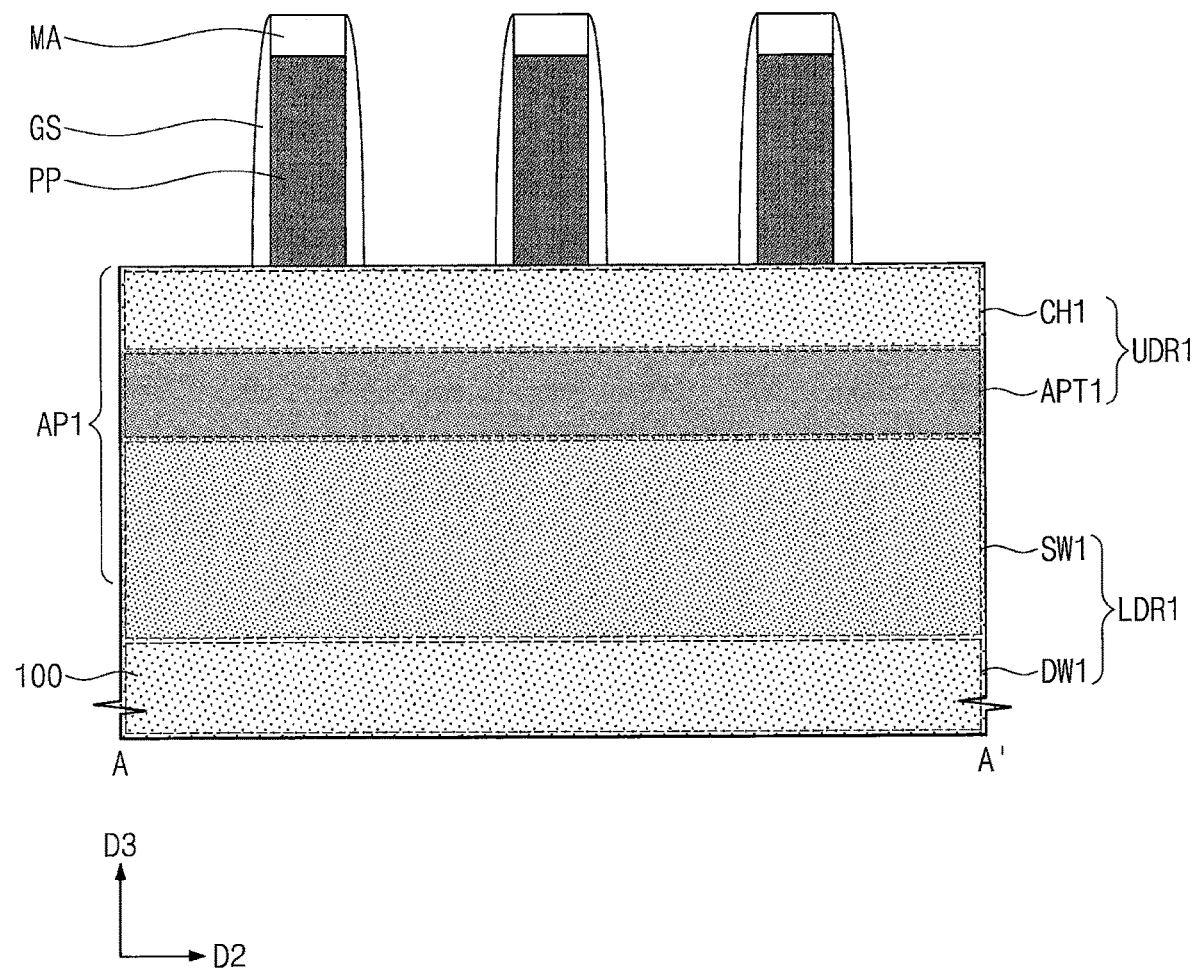
Figure 10B:
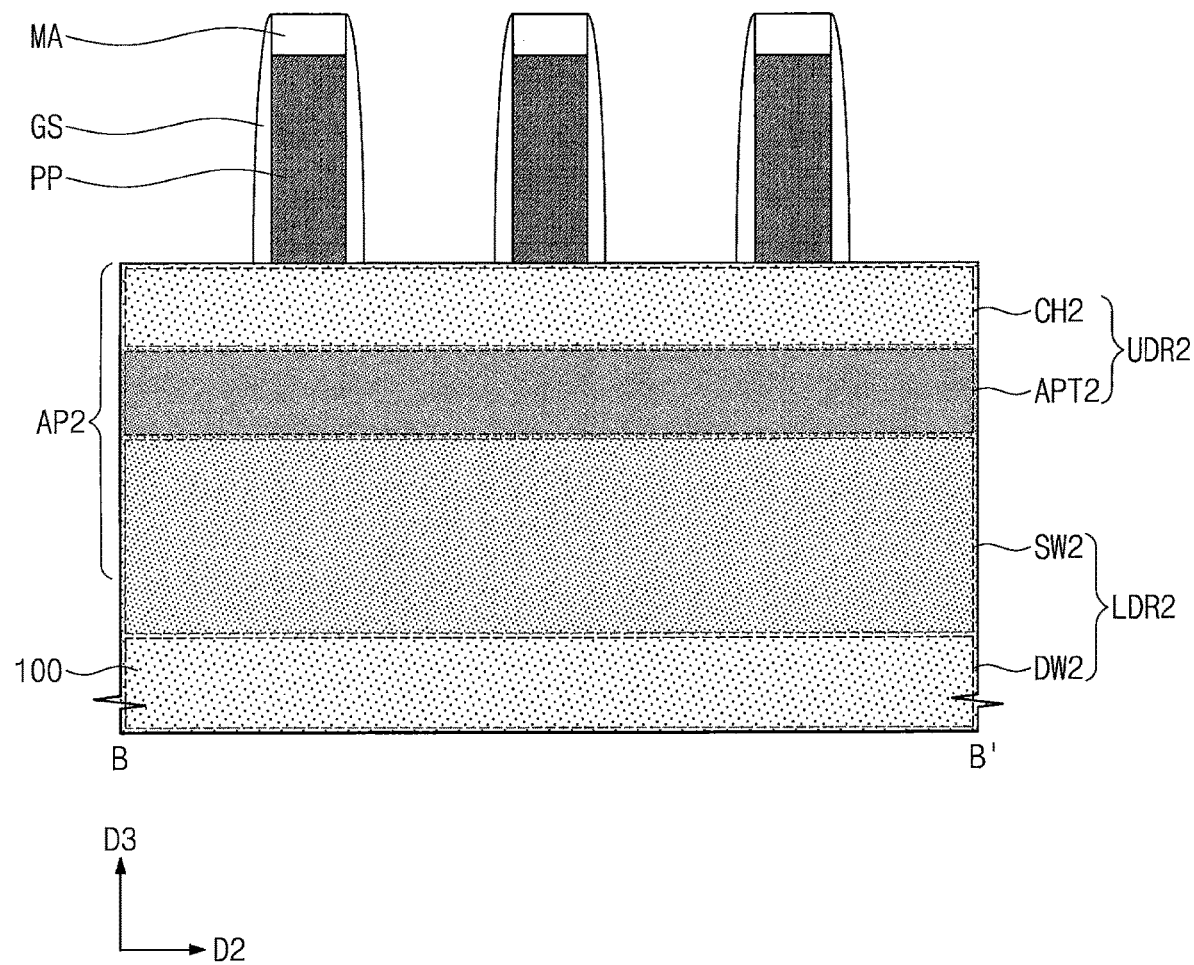
Figure 10C:
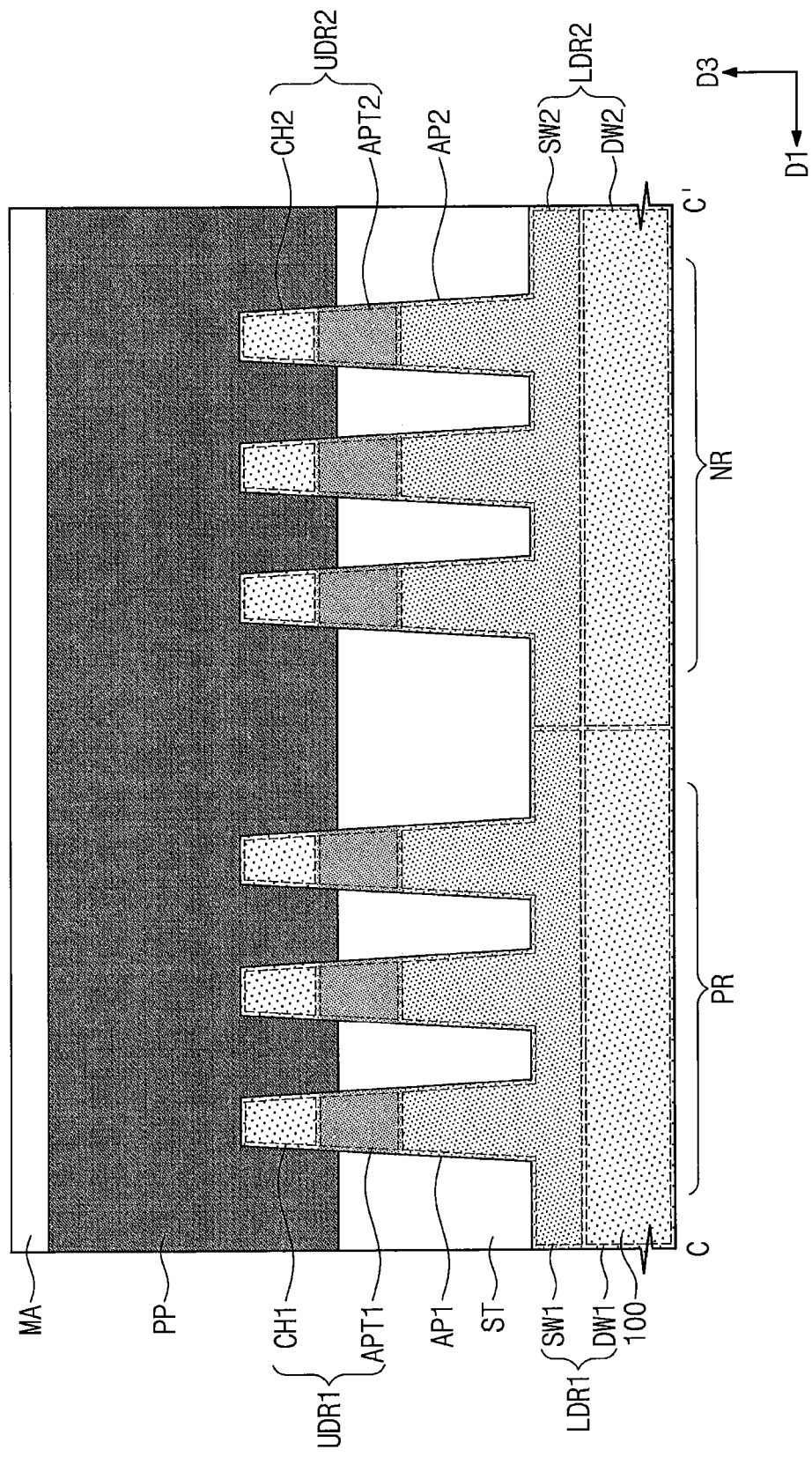
Figure 10D:
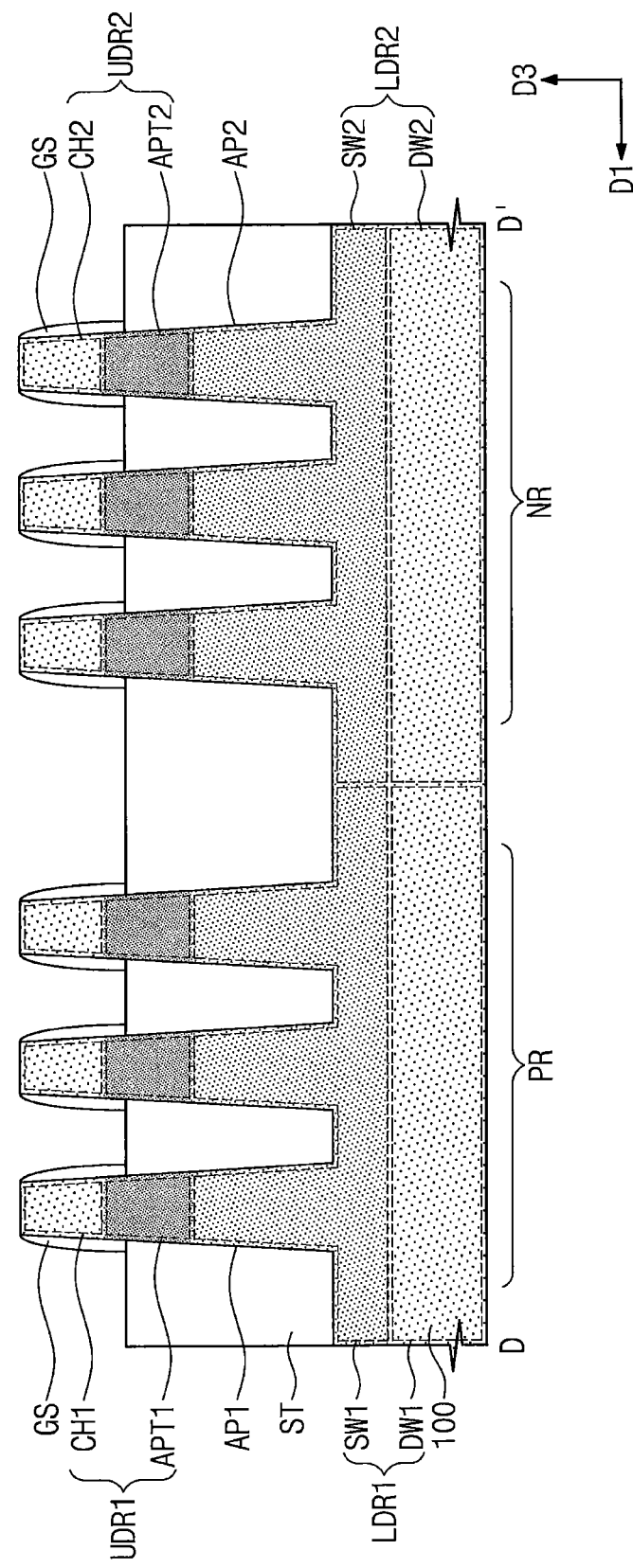
FIGS. 10D, 12D and 14D are cross-sectional views taken along lines D-D' of FIGS. 9, 11 and 13, respectively.
Figure 11:
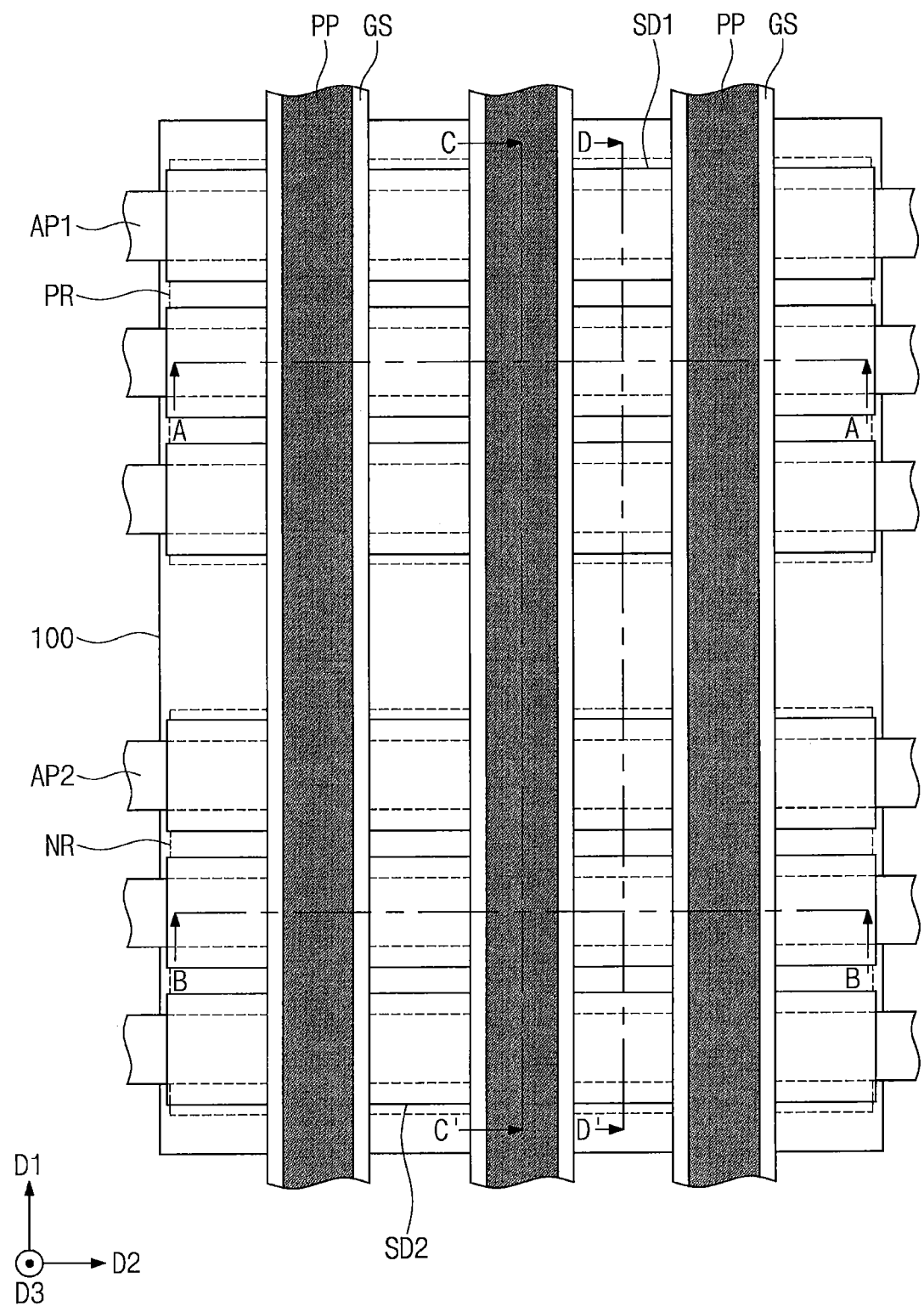
Figure 12A:
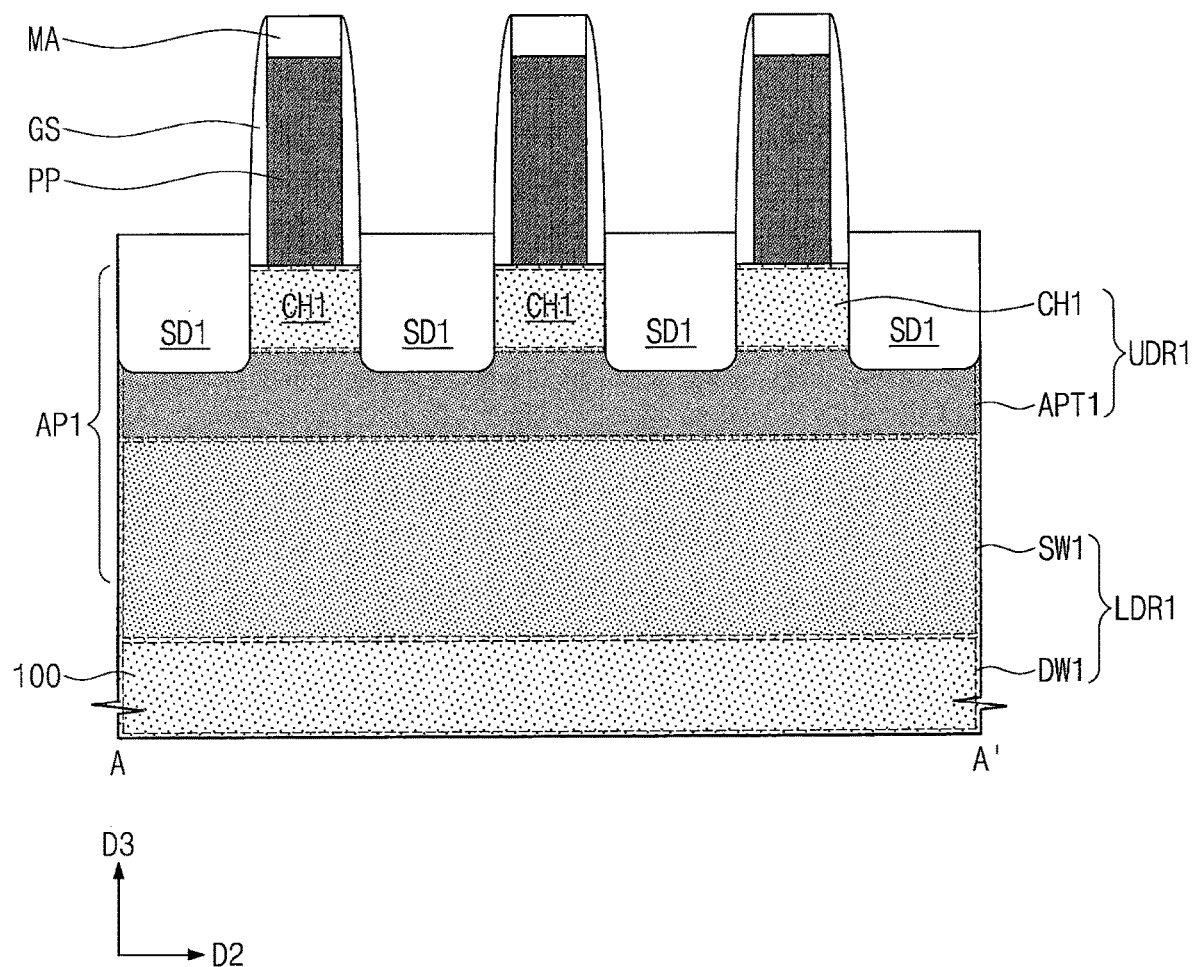
Figure 12B:
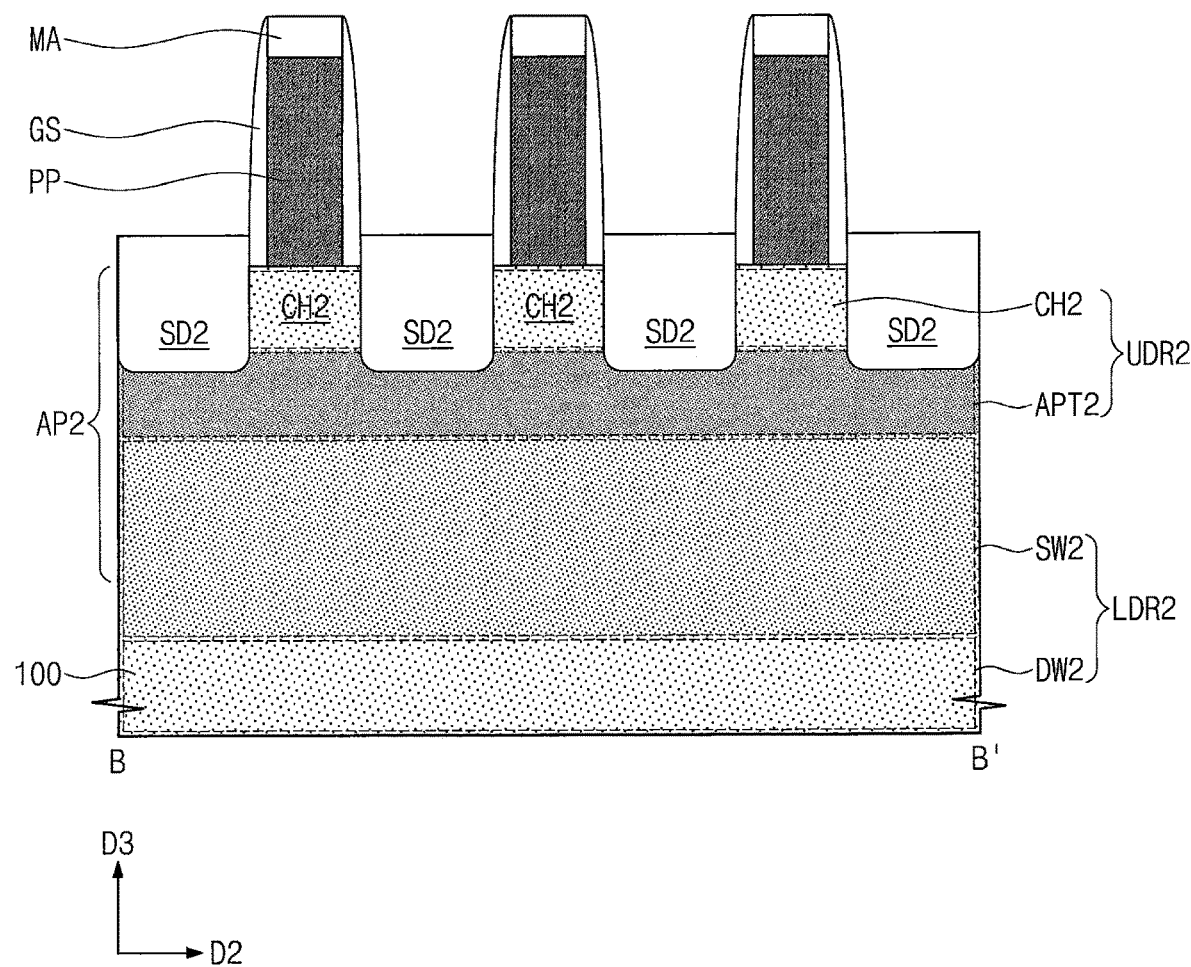
Figure 12C:
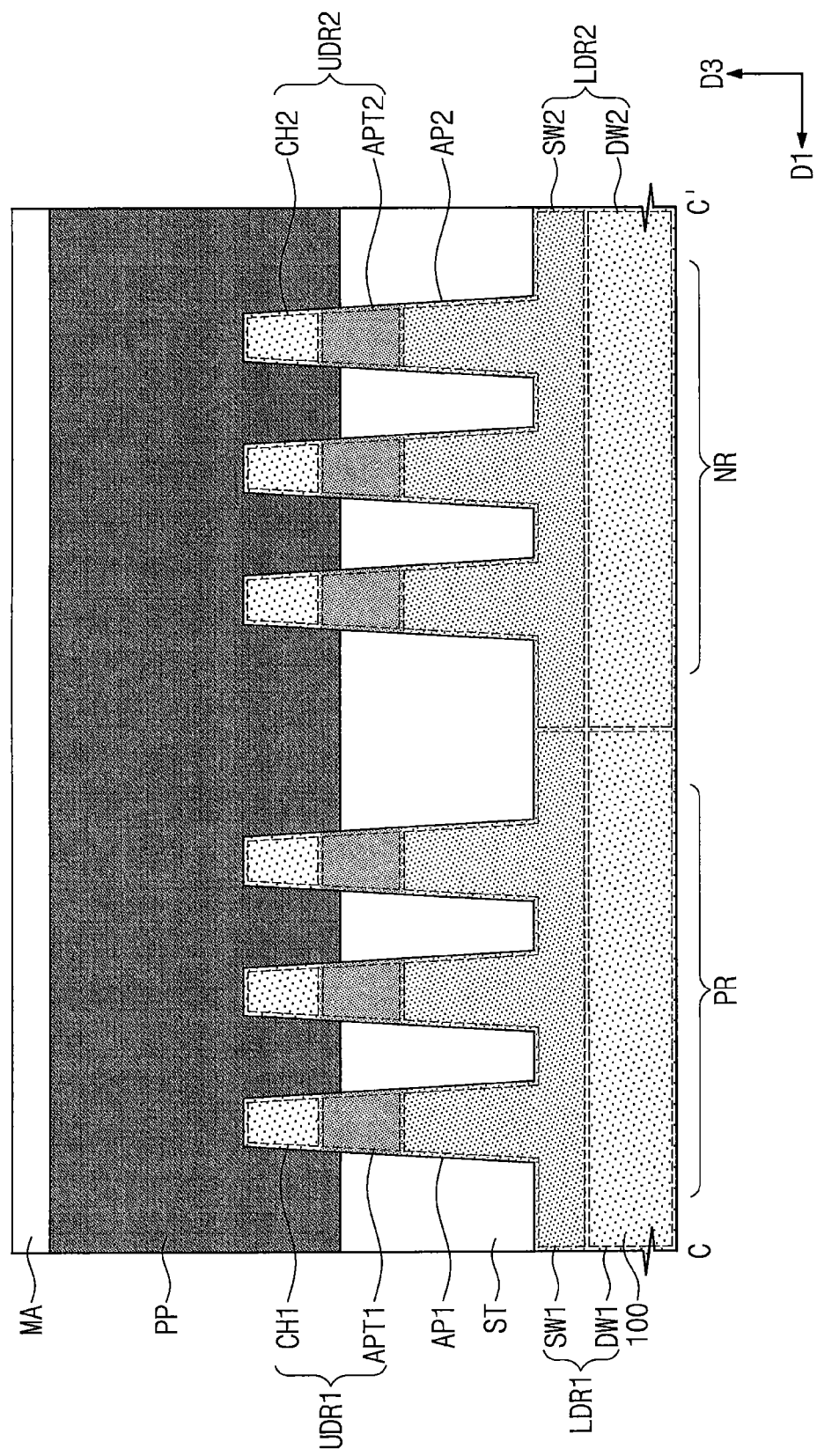
Figure 12D:
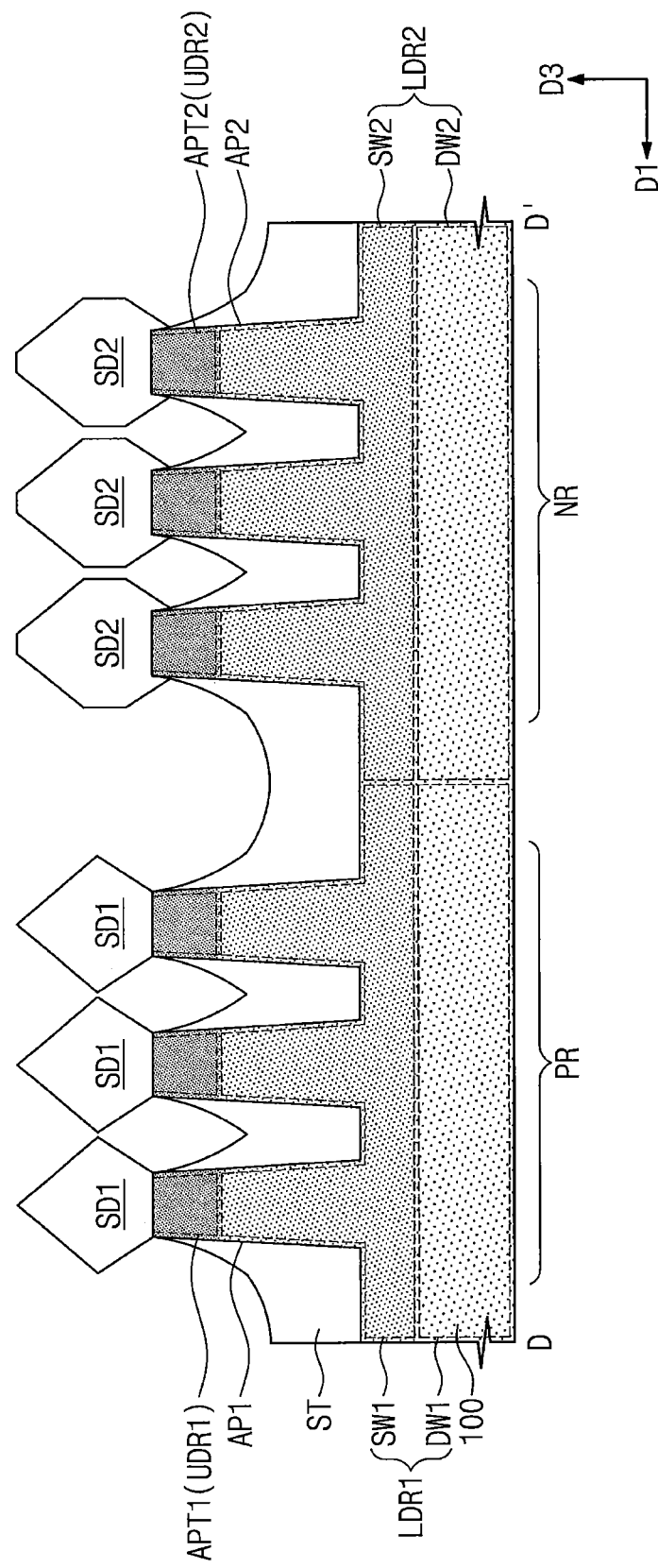
Figure 13:
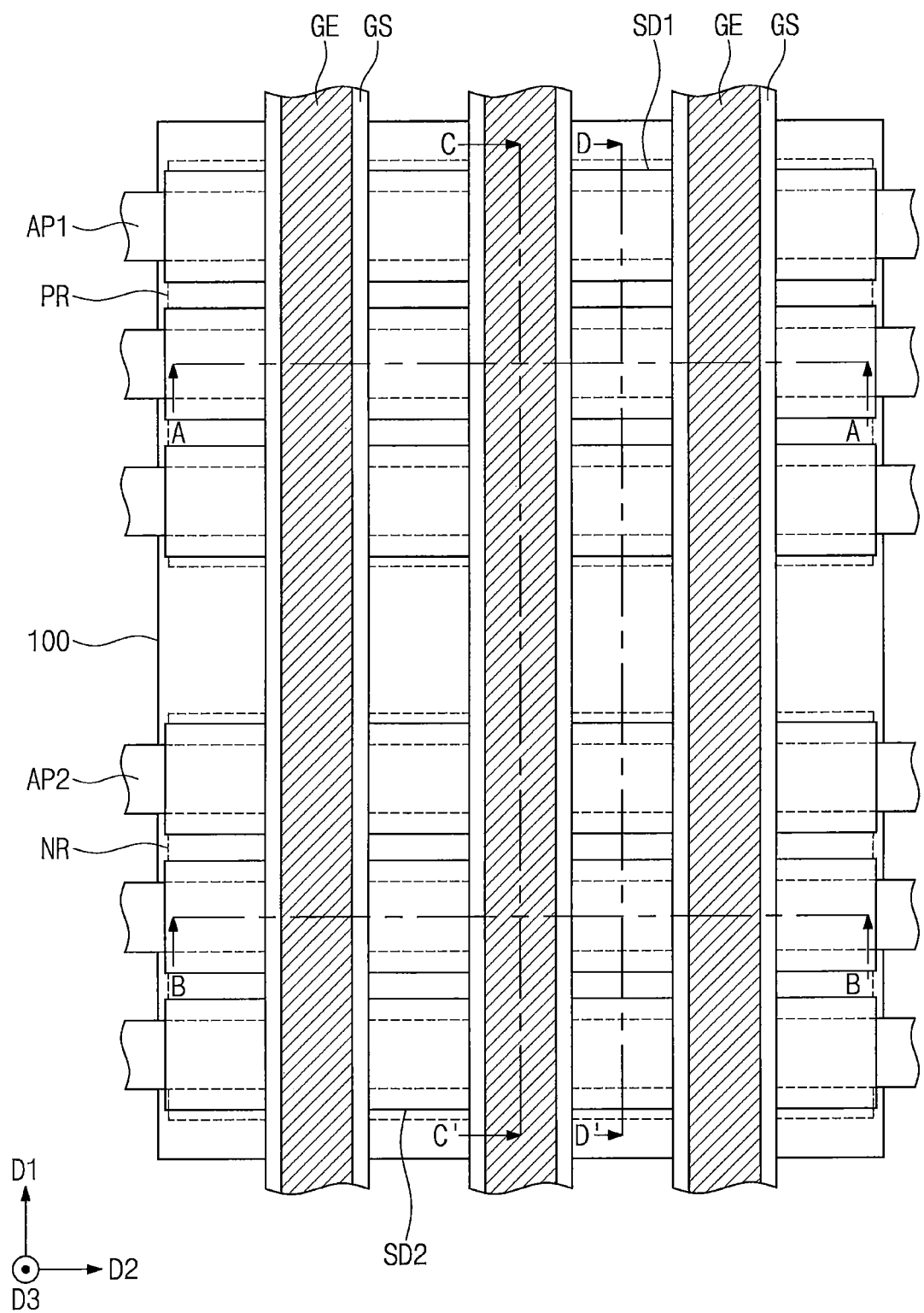
Figure 14A:
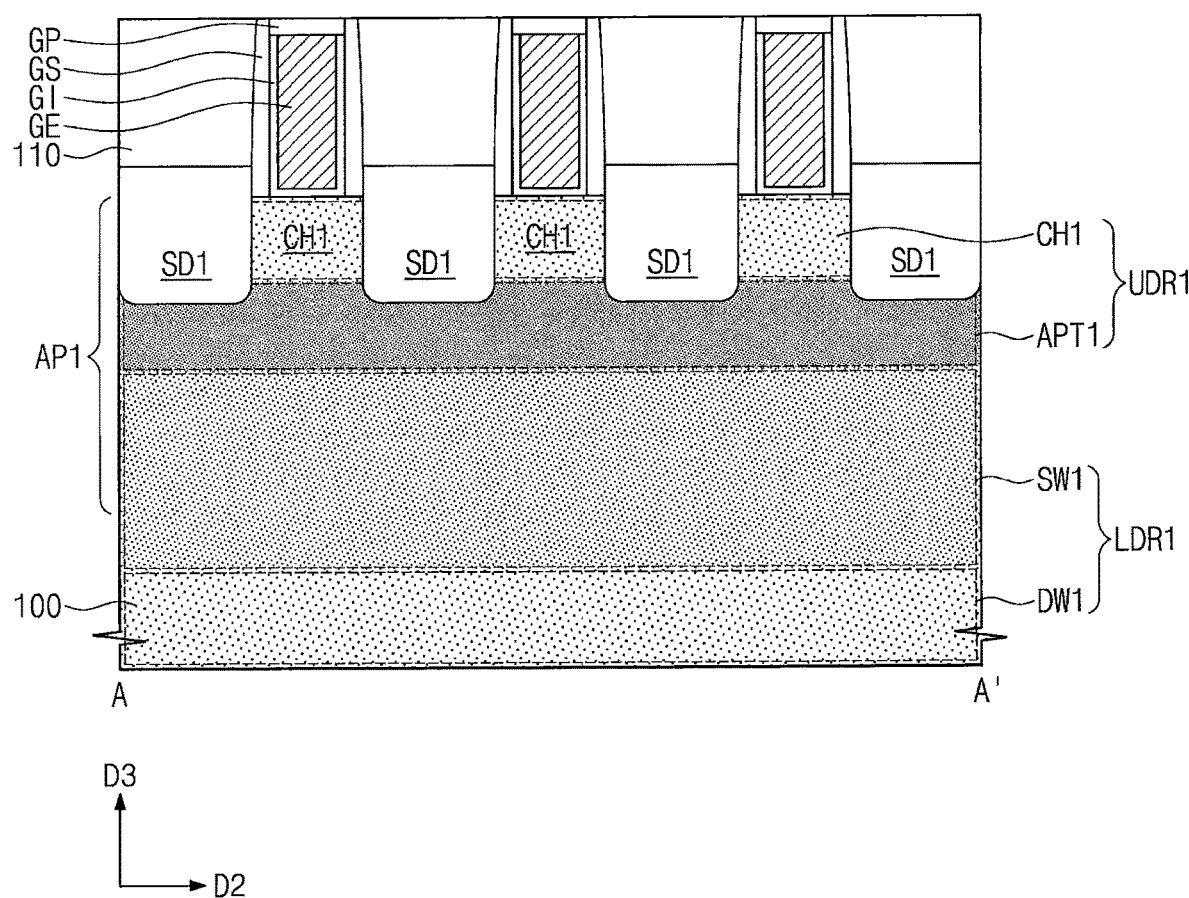
Figure 14B:
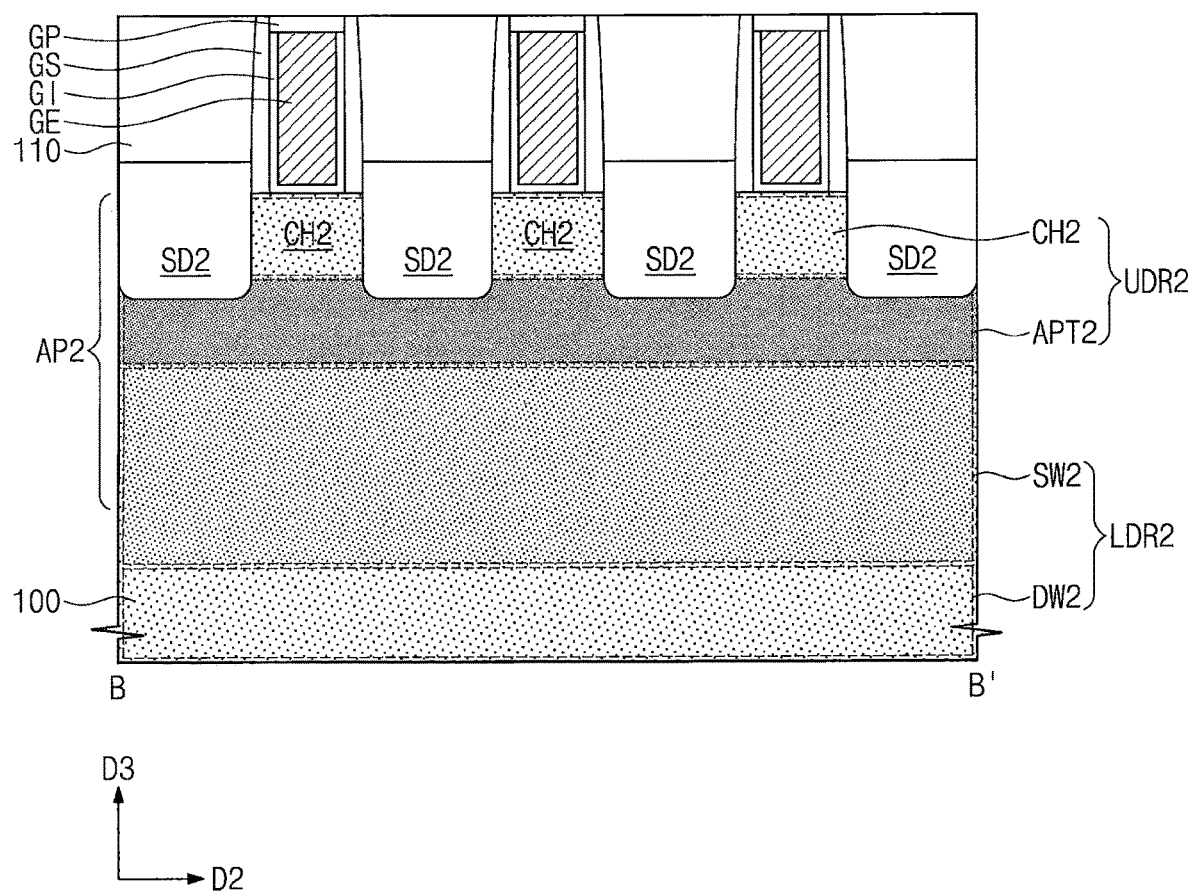
Figure 14C:
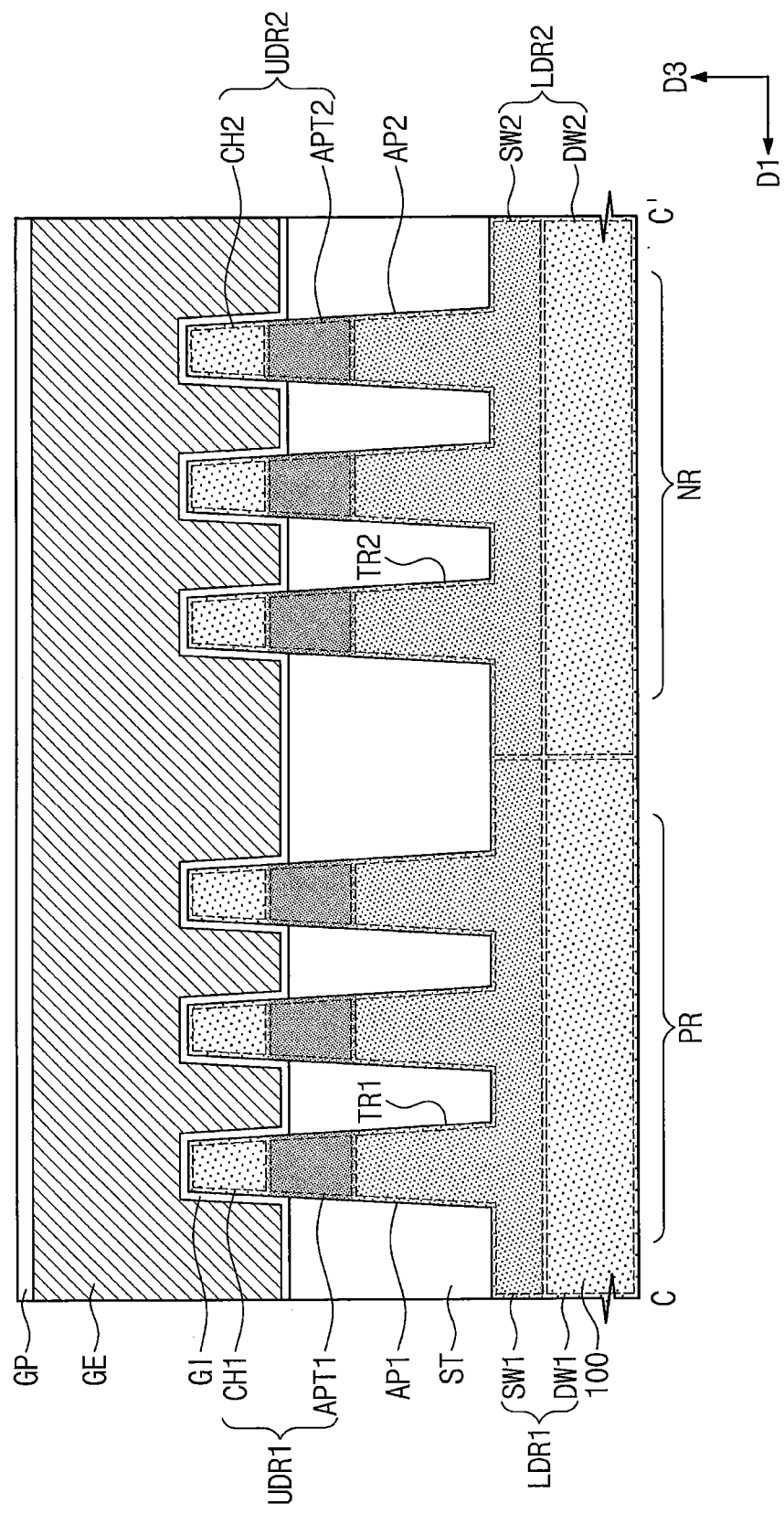
Figure 14D:
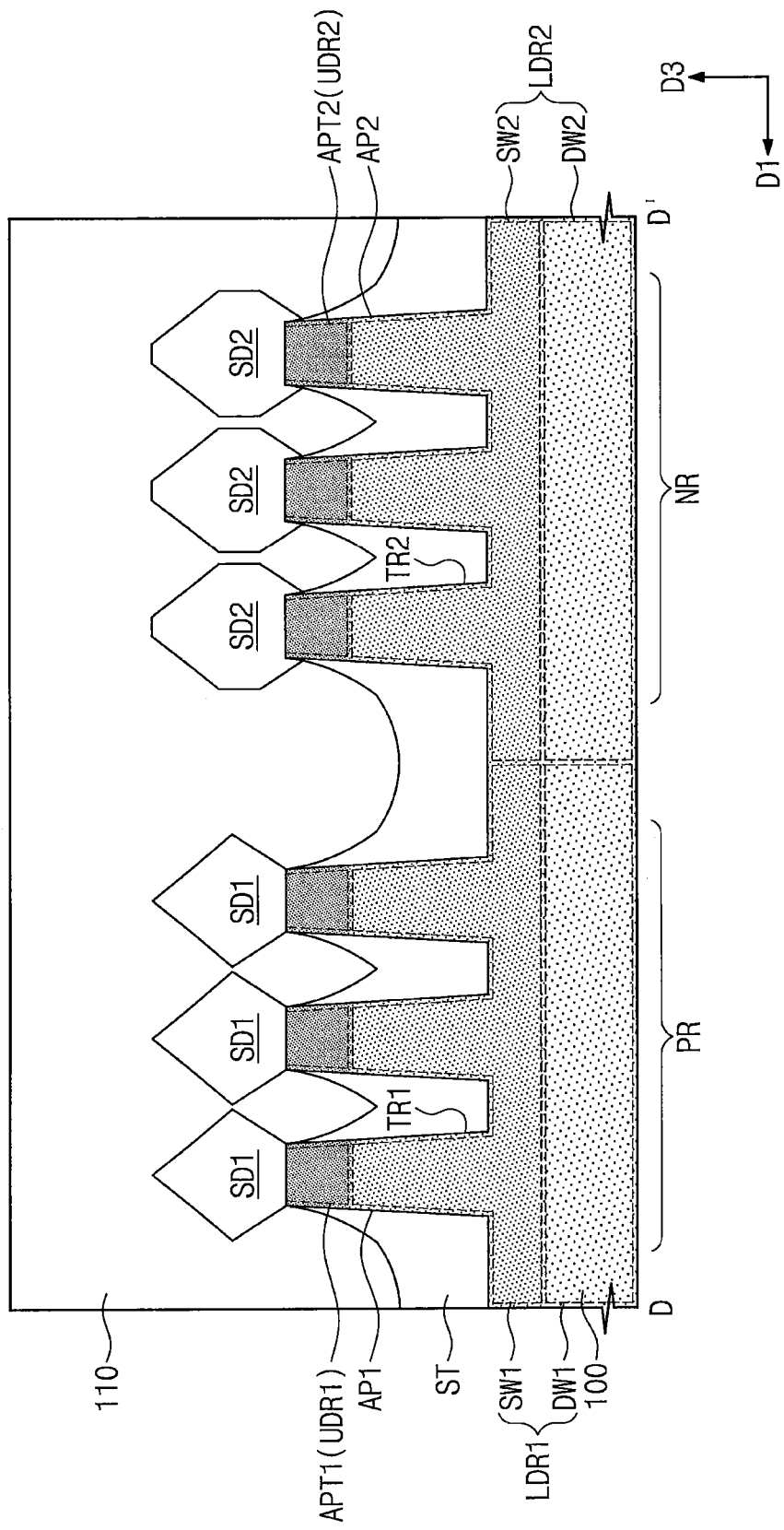
Figure 15:
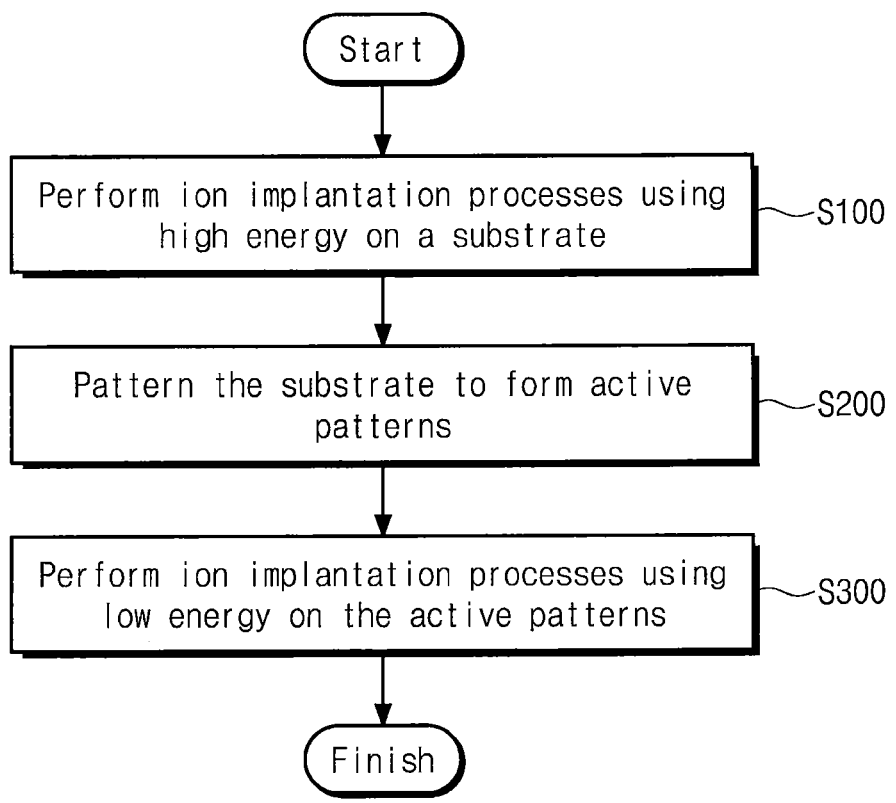
FIG. 15 is a process flowchart illustrating an ion implantation process according to some embodiments of the inventive concepts.

FIGS. 3, 5, 7, 9, 11 and 13 are plan views illustrating a method for manufacturing a semiconductor device according to some embodiments of the inventive concepts. FIGS. 4A, 6A, 8A, 10A, 12A and 14A are cross-sectional views taken along lines A-A' of FIGS. 3, 5, 7, 9, 11 and 13, respectively. FIGS. 4B, 6B, 8B, 10B, 12B and 14B are cross-sectional views taken along lines B-B' of FIGS. 3, 5, 7, 9, 11 and 13, respectively. FIGS. 4C, 6C, 8C, 10C, 12C and 14C are cross-sectional views taken along lines C-C' of FIGS. 3, 5, 7, 9, 11 and 13, respectively. FIGS. 10D, 12D and 14D are cross-sectional views taken along lines D-D' of FIGS. 9, 11 and 13, respectively. FIG. 15 is a process flowchart illustrating an ion implantation process according to some embodiments of the inventive concepts.

Referring to FIGS. 3, 4A to 4C and 15, a substrate 100 including a PMOSFET region PR and an NMOSFET region NR may be provided. The substrate 100 may be a semiconductor substrate including silicon, germanium, or silicon-germanium or may be a compound semiconductor substrate. In some embodiments, the substrate 100 may be a silicon substrate. Ion implantation processes using high energy may be performed on the substrate 100 to form a first lower dopant region LDR1 and a second lower dopant region LDR2 in the PMOSFET region PR and the NMOSFET region NR, respectively (S100).

The formation of the first lower dopant region LDR1 may include forming a first deep well region DW1 in the PMOSFET region PR and forming a first shallow well region SW1 in the PMOSFET region PR. A first mask layer (not shown) may be formed on the NMOSFET region NR of the substrate 100. The first mask layer may expose the PMOSFET region PR. A first ion implantation process may be performed to form the first deep well region DW1 in the PMOSFET region PR. A second ion implantation process may be performed to form the first shallow well region SW1 in the PMOSFET region PR. The first and second ion implantation processes may be the ion implantation processes using the high energy. The first mask layer may prevent dopant ions from being implanted into the NMOSFET region NR during the first ion implantation process and the second ion implantation process.

The first and second ion implantation processes may be performed, for example, using dopants such as phosphorus (P). The first ion implantation process may be performed at a higher power than the second ion implantation process. For example, the first ion implantation process may be performed at energy of 150 keV to 300 keV, and the second ion implantation process may be performed at energy of 50 keV to 150 keV. Thus, the first deep well region DW1 may be formed under the first shallow well region SW1.

A dopant ion dose of the first ion implantation process may be lower than a dopant ion dose of the second ion implantation process. For example, the dopant ion dose of the first ion implantation process and the dopant ion dose of the second ion implantation process may range from 5.00 E12/cm$^2$ to 5.00 E13/cm$^2$.

The formation of the second lower dopant region LDR2 may include forming a second deep well region DW2 in the NMOSFET region NR and forming a second shallow well region SW2 in the NMOSFET region NR. The first mask layer may be selectively removed. A second mask layer (not shown) may be formed on the PMOSFET region PR of the substrate 100. The second mask layer may expose the NMOSFET region NR. A third ion implantation process may be performed to form the second deep well region DW2 in the NMOSFET region NR. A fourth ion implantation process may be performed to form the second shallow well region SW2 in the NMOSFET region NR. The third and fourth ion implantation processes may be the ion implantation processes using the high energy. The second mask layer may prevent dopant ions from being implanted into the PMOSFET region PR during the third ion implantation process and the fourth ion implantation process.

The third and fourth ion implantation processes may be performed, for example, using dopants such as boron (B). The third ion implantation process may be performed at a higher power than the fourth ion implantation process. For example, the third ion implantation process may be performed at energy of 50 keV to 150 keV, and the fourth ion implantation process may be performed at energy of 30 keV to 50 keV. Other features of the third and fourth ion implantation processes may be substantially the same or similar as corresponding features of the first and second ion implantation processes described above.

A first annealing process may be performed after the ion implantation processes using the high energy. The dopants in the first and second lower dopant regions LDR1 and LDR2 may be diffused and/or activated by the first annealing process. For example, the first annealing process may be a low-temperature soak annealing process, a flash lamp annealing process, a laser annealing process, or a spike annealing process.

Referring to FIGS. 5, 6A to 6C and 15, the substrate 100 may be patterned to form first and second active patterns AP1 and AP2 (S200). The first active patterns AP1 may be formed on the PMOSFET region PR and the second active patterns AP2 may be formed on the NMOSFET region NR.

In more detail, the formation of the first and second active patterns AP1 and AP2 may include forming mask patterns MP on the substrate 100, and anisotropically etching the substrate 100 by using the mask patterns MP as etch masks. First trenches TR1 may be formed between the first active patterns AP1. Second trenches TR2 may be formed between the second active patterns AP2. Bottom surfaces of the first trenches TR1 may be located at a level between a bottom surface and a top surface of the first shallow well region SW1. Bottom surfaces of the second trenches TR2 may be located at a level between a bottom surface and a top surface of the second shallow well region SW2.

Referring to FIGS. 7, 8A to 8C and 15, a device isolation layer ST may be formed in the first and second trenches TR1 and TR2. The device isolation layer ST may be formed of, for example, an insulating material such as a silicon oxide layer.

Ion implantation processes using low energy may be performed on the first and second active patterns AP1 and AP2 to form a first upper dopant region UDR1 in the first active patterns AP1 and a second upper dopant region UDR2 in the second active patterns AP2 (S300).

The formation of the first upper dopant region UDR1 may include forming a first anti-punch through region APT1 in an upper portion of each of the first active patterns AP1 and forming a first channel region CH1 in the upper portion of each of the first active patterns AP1. A third mask layer (not shown) may be formed on the NMOSFET region NR of the substrate 100. The third mask layer may expose the PMOSFET region PR. A fifth ion implantation process may be performed to form the first anti-punch through regions APT1 in the first active patterns AP1 of the PMOSFET region PR. A sixth ion implantation process may be performed to form the first channel regions CH1 in the first active patterns AP1 of the PMOSFET region PR. The fifth and sixth ion implantation processes may be the ion implantation processes using the low energy. The third mask layer may prevent dopant ions from being implanted into the NMOSFET region NR during the fifth ion implantation process and the sixth ion implantation process.

The fifth ion implantation process may be performed, for example, using dopants such as arsenic (As). The sixth ion implantation process may be performed, for example, using dopants such as phosphorus (P). The fifth ion implantation process may be performed at a higher power than the sixth ion implantation process. For example, the fifth ion implantation process may be performed at energy of 50 keV to 150 keV, and the sixth ion implantation process may be performed at energy of 10 keV to 50 keV. Thus, the first anti-punch through region APT1 may be formed under the first channel region CH1. The ion implantation processes using the low energy may be performed at lower powers than the ion implantation processes using the high energy, and thus the first upper dopant region UDR1 may be formed on the first lower dopant region LDR1.

A dopant ion dose of the fifth ion implantation process may be higher than a dopant ion dose of the sixth ion implantation process. For example, the dopant ion dose of the fifth ion implantation process may range from 5.00 E12/cm$^2$ to 5.00 E13/cm$^2$, and the dopant ion dose of the sixth ion implantation process may range from 1.00 E12/cm$^2$ to 5.00 E12/cm$^2$.

The formation of the second upper dopant region UDR2 may include forming a second anti-punch through region APT2 in an upper portion of each of the second active patterns AP2 and forming a second channel region CH2 in the upper portion of each of the second active patterns AP2. The third mask layer may be selectively removed. A fourth mask layer (not shown) may be formed on the PMOSFET region PR of the substrate 100. The fourth mask layer may expose the NMOSFET region NR. A seventh ion implantation process may be performed to form the second anti-punch through regions APT2 in the second active patterns AP2 of the NMOSFET region NR. An eighth ion implantation process may be performed to form the second channel regions CH2 in the second active patterns AP2 of the NMOSFET region NR. The seventh and eighth ion implantation processes may be the ion implantation processes using the low energy. The fourth mask layer may prevent dopant ions from being implanted into the PMOSFET region PR during the seventh ion implantation process and the eighth ion implantation process.

The seventh ion implantation process may be performed, for example, using dopants such as boron (B). The eighth ion implantation process may be performed, for example, using dopants such as BF$_2$. For example, the seventh ion implantation process may be performed at energy of 10 keV to 30 keV, and the eighth ion implantation process may be performed at energy of 30 keV to 70 keV. Other features of the seventh and eighth ion implantation processes may be substantially the same or similar as corresponding features of the fifth and sixth ion implantation processes described above.

A second annealing process may be performed after the ion implantation processes using the low energy. The dopants in the first and second upper dopant regions UDR1 and UDR2 may be diffused and/or activated by the second annealing process. For example, the second annealing process may be a low-temperature soak annealing process, a flash lamp annealing process, a laser annealing process, or a spike annealing process.

Though the description herein references high energy ion implantation and low energy ion implantation, it will be understood that these terms are relative terms and are not limiting of the actual energy used. Moreover, in some embodiments, the relative levels of the high energy and low energy ion implantation may depend on the conductivity type of the respective region. For example, a level of energy used in a high energy ion implantation in the PMOSFET region PR may be different from a level of energy used in a high energy ion implantation in the NMOSFET region NR. In some embodiments, a level of energy used for a high energy ion implantation in the NMOSFET region NR may be substantially the same or similar to a level of energy used for a low energy ion implantation in the PMOSFET region PR.

Referring to FIGS. 9 and 10A to 10D, sacrificial patterns PP may be formed to intersect the first and second active patterns AP1 and AP2. The sacrificial patterns PP may have, for example, line shapes or bar shapes, which extend in the first direction D1. In detail, the formation of the sacrificial patterns PP may include forming a sacrificial layer on an entire top surface of the substrate 100, forming hard mask patterns MA on the sacrificial layer, and patterning the sacrificial layer using the hard mask patterns MA as etch masks. The sacrificial layer may include, for example, a poly-silicon layer.

A pair of gate spacers GS may be formed on both sidewalls of each of the sacrificial patterns PP, respectively. The gate spacers GS may also be formed on both sidewalls of portions of each of the first and second active patterns AP1 and AP2 that are not covered by the device isolation layer ST and the sacrificial patterns PP (e.g., exposed portions of the first and second active patterns AP1 and AP2).

The formation of the gate spacers GS may include conformally forming a spacer layer on an entire top surface of the substrate 100 and anisotropically etching the spacer layer. For example, the spacer layer may include at least one of SiCN, SiCON, or SiN. In certain embodiments, the spacer layer may be formed of a multi-layer including at least two of SiCN, SiCON, or SiN.

Referring to FIGS. 11 and 12A to 12D, first source/drain patterns SD1 may be formed in an upper portion of each of the first active patterns AP1. A pair of the first source/drain patterns SD1 may be formed at both sides of each of the sacrificial patterns PP.

In detail, the upper portions of the first active patterns AP1 may be etched using the hard mask patterns MA and the gate spacers GS as etch masks to form first recess regions. The gate spacers GS on the both sidewalls of each of the first active patterns AP1 may be removed while the upper portions of the first active patterns AP1 are etched. The device isolation layer ST between the first active patterns AP1 may be recessed while the upper portions of the first active patterns AP1 are etched.

The first source/drain patterns SD1 may be formed by performing a selective epitaxial growth (SEG) process using inner surfaces of the first recess regions of the first active patterns AP1 as a seed layer. Since the first source/drain patterns SD1 are formed, the first channel region CH1 may be disposed between a pair of the first source/drain patterns SD1. For example, the SEG process may include a chemical vapor deposition (CVD) process or a molecular beam epitaxy (MBE) process. The first source/drain patterns SD1 may include a semiconductor material (e.g., SiGe) of which a lattice constant is greater than that of a semiconductor element of the substrate 100. In some embodiments, each of the first source/drain patterns SD1 may be formed of a plurality of stacked semiconductor layers.

In some embodiments, dopants may be injected in-situ into the first source/drain pattern SD1 during the SEG process for forming the first source/drain patterns SD1. In certain embodiments, the dopants may be injected or implanted into the first source/drain patterns SD1 after the SEG process for forming the first source/drain patterns SD1. The first source/drain patterns SD1 may be doped with the dopants to have the second conductivity type (e.g., the P-type).

Second source/drain patterns SD2 may be formed in an upper portion of each of the second active patterns AP2. A pair of the second source/drain patterns SD2 may be formed at both sides of each of the sacrificial patterns PP.

In detail, the upper portions of the second active patterns AP2 may be etched using the hard mask patterns MA and the gate spacers GS as etch masks to form second recess regions. The second source/drain patterns SD2 may be formed by performing a SEG process using inner surfaces of the second recess regions of the second active patterns AP2 as a seed layer. Since the second source/drain patterns SD2 are formed, the second channel region CH2 may be disposed between a pair of the second source/drain patterns SD2. For example, the second source/drain patterns SD2 may include the same semiconductor element (e.g., silicon) as the substrate 100. The second source/drain patterns SD2 may be doped with dopants to have the first conductivity type (e.g., the N-type).

The first source/drain patterns SD1 and the second source/drain patterns SD2 may be sequentially formed by different processes from each other. In other words, the first source/drain patterns SD1 may not be formed simultaneously with the second source/drain patterns SD2.

Referring to FIGS. 13 and 14A to 14D, a first interlayer insulating layer 110 may be formed to be on, and, in some embodiments, cover, the first and second source/drain patterns SD1 and SD2, the hard mask patterns MA, and the gate spacers GS. For example, the first interlayer insulating layer 110 may include a silicon oxide layer.

The first interlayer insulating layer 110 may be planarized until top surfaces of the sacrificial patterns PP are exposed. The planarization process of the first interlayer insulating layer 110 may be performed using an etch-back process or a chemical mechanical polishing (CMP) process. In some embodiments, the hard mask patterns MA may be completely removed during the planarization process. As a result, a top surface of the first interlayer insulating layer 110 may be substantially coplanar with the top surfaces of the sacrificial patterns PP and top surfaces of the gate spacers GS. The exposed sacrificial patterns PP may be selectively removed.

Empty spaces may be formed by the removal of the sacrificial patterns PP. A gate dielectric pattern GI, a gate electrode GE and a gate capping pattern GP may be formed in each of the empty spaces. The gate dielectric pattern GI may be conformally formed in the empty space and may not completely fill the empty space. The gate dielectric pattern GI may be formed using an atomic layer deposition (ALD) process or a chemical oxidation process. For example, the gate dielectric pattern GI may include a high-k dielectric material. For example, the high-k dielectric material may include at least one of hafnium oxide, hafnium-silicon oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, or lead-zinc niobate.

A gate electrode layer may be formed to be within and, in some embodiments, completely fill, the empty space, and a planarization process may be performed on the gate electrode layer to form the gate electrode GE. For example, the gate electrode layer may include at least one of a conductive metal nitride (e.g., titanium nitride or tantalum nitride) and/or a metal material (e.g., titanium, tantalum, tungsten, copper, or aluminum).

Subsequently, an upper portion of the gate electrode GE may be recessed. The gate capping pattern GP may be formed on the recessed gate electrode GE. For example, the gate capping pattern GP may include at least one of SiON, SiCN, SiCON, or SiN.

Referring again to FIGS. 1 and 2A to 2D, a second interlayer insulating layer 120 may be formed on the first interlayer insulating layer 110. The second interlayer insulating layer 120 may include a silicon oxide layer and/or a low-k oxide layer. For example, the low-k oxide layer may include a silicon oxide layer doped with carbon, e.g., SiCOH. The second interlayer insulating layer 120 may be formed by a CVD process.

Contact holes may be formed to penetrate the second interlayer insulating layer 120 and the first interlayer insulating layer 110. The contact holes may expose the first and second source/drain patterns SD1 and SD2. Contacts AC may be formed in the contact holes. The contacts AC may be in contact with ones of the first and second source/drain patterns SD1 and SD2. Each of the contacts AC may include a conductive pillar 165 and a barrier layer 160 surrounding the conductive pillar 165.

In detail, the barrier layer 160 may be formed to partially fill the contact holes. The barrier layer 160 may include a metal layer and/or a metal nitride layer. The metal layer may include, for example, at least one of titanium, tantalum, tungsten, nickel, cobalt, or platinum. The metal nitride layer may include, for example, at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer. A conductive layer may be formed to be within and, in some embodiments, completely fill the contact holes. The conductive layer and the barrier layer 160 may be planarized until a top surface of the second interlayer insulating layer 120 is exposed, thereby forming the conductive pillar 165. For example, the conductive pillar 165 may include at least one selected from metal materials such as aluminum, copper, tungsten, molybdenum, and cobalt.

Figure 16A:
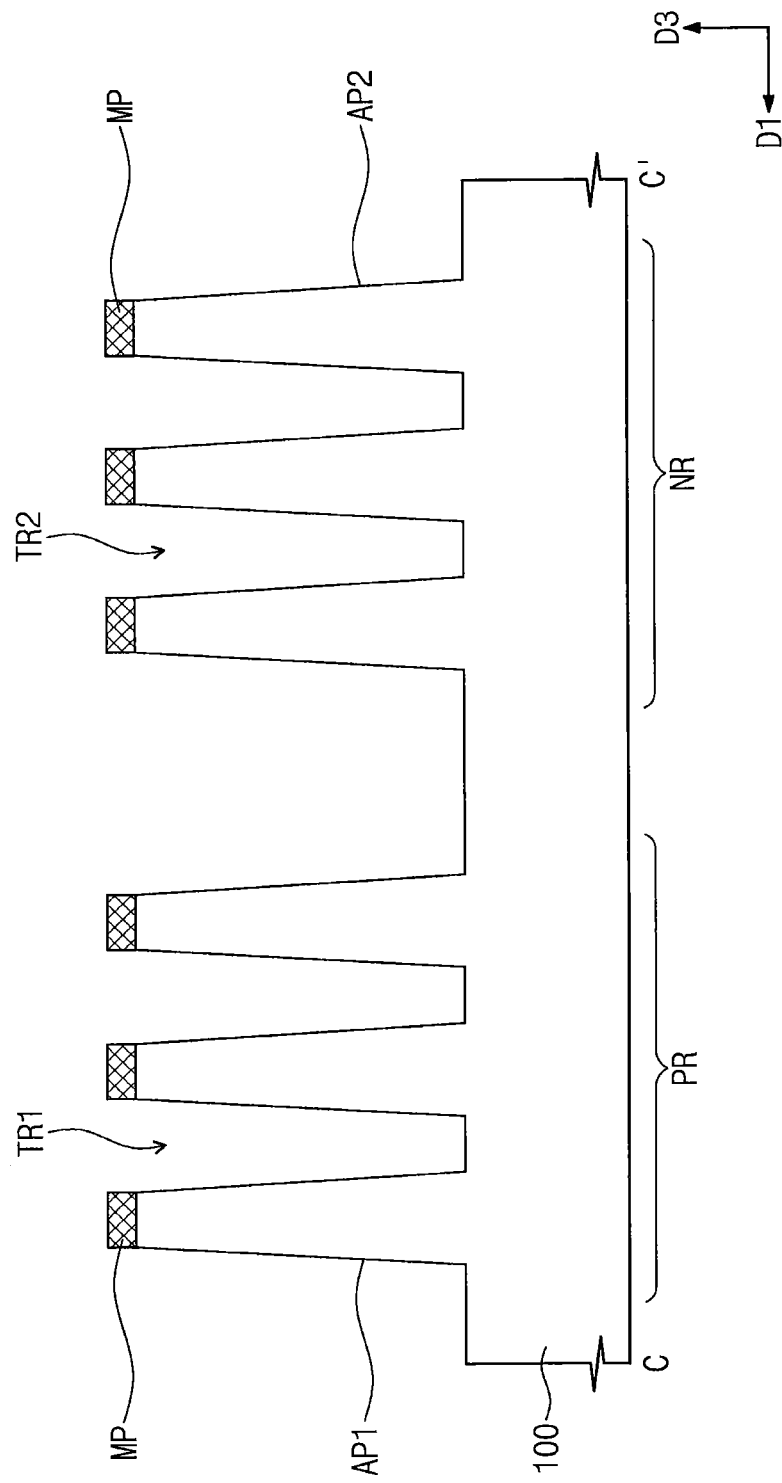
FIGS. 16A and 16B are cross-sectional views illustrating a first comparative example different from the manufacturing method according to some embodiments of the inventive concepts.
Figure 16B:
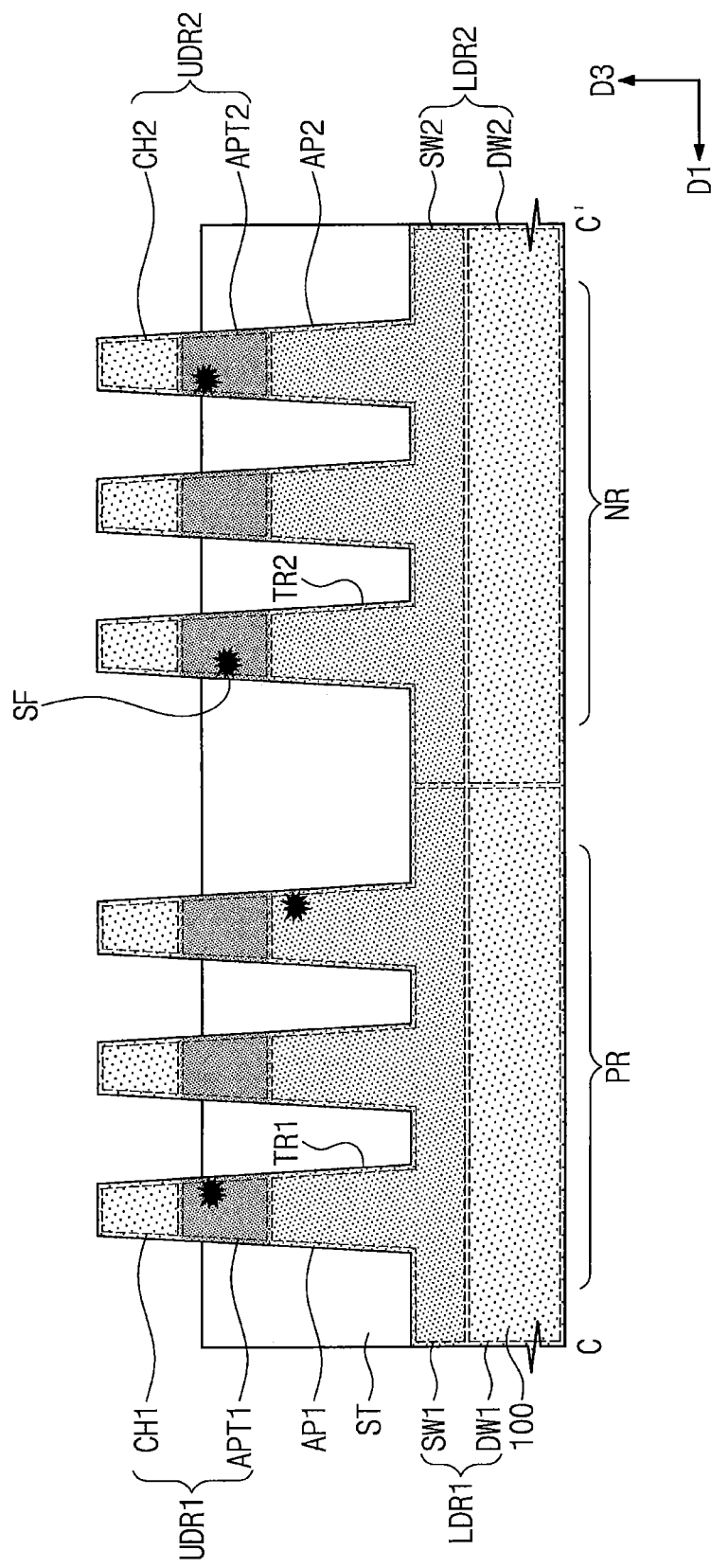

FIGS. 16A and 16B are cross-sectional views illustrating a first comparative example different from the manufacturing method according to some embodiments of the inventive concepts.

Referring to FIG. 16A, the substrate 100 may be patterned in a state in which the ion implantation processes using the high energy are not performed on the substrate 100. The substrate 100 may be patterned to form first and second active patterns AP1 and AP2.

Referring to FIG. 16B, the device isolation layer ST may be formed in the first and second trenches TR1 and TR2. The ion implantation processes using the high energy may be performed on the first and second active patterns AP1 and AP2 to form the first and second lower dopant regions LDR1 and LDR2. The ion implantation processes using the low energy may be performed on the first and second active patterns AP1 and AP2 to form the first and second upper dopant regions UDR1 and UDR2.

According to the first comparative example, both the ion implantation processes using the high energy and the ion implantation processes using the low energy may be performed after the formation of the first and second active patterns AP1 and AP2. In this case, the first and second active patterns AP1 and AP2 may be damaged by the ion implantation processes using the high energy. The damage may cause lattice faults (e.g., stacking faults SF) in the first and second active patterns AP1 and AP2.

Figure 17A:
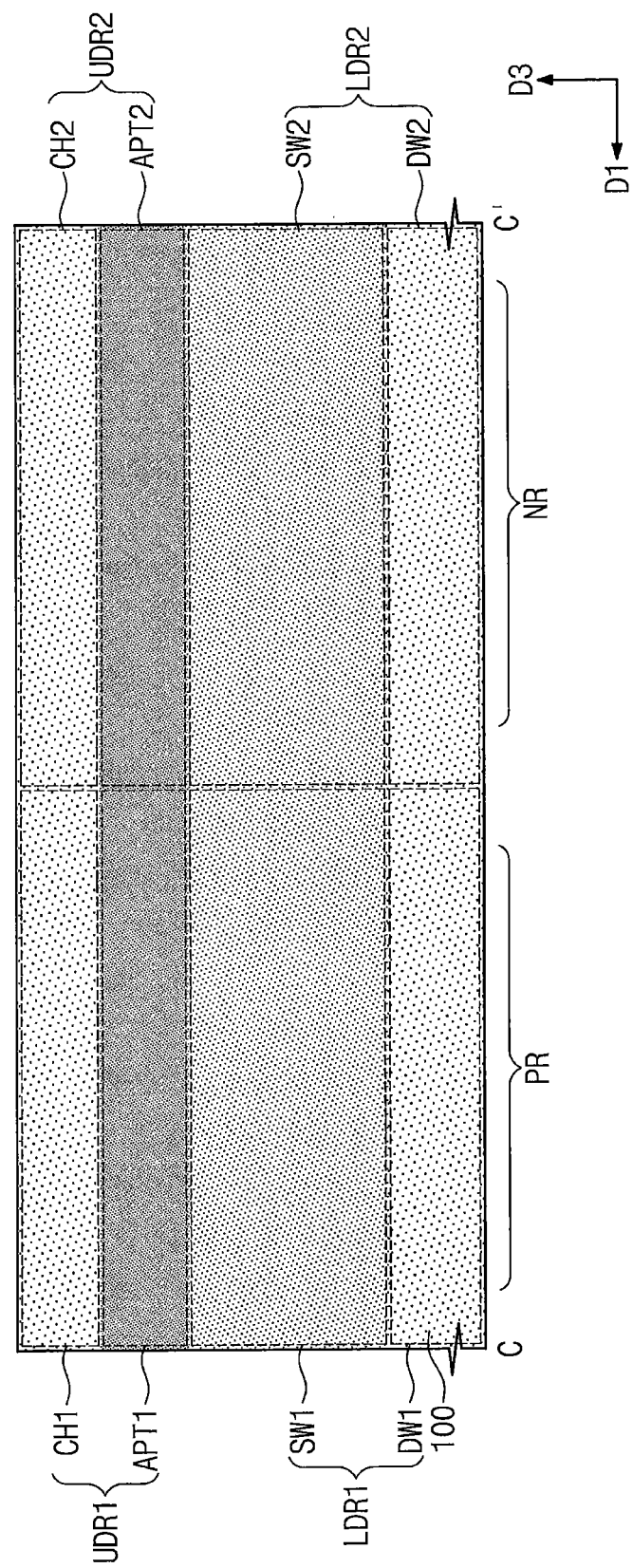
FIGS. 17A and 17B are cross-sectional views illustrating a second comparative example different from the manufacturing method according to some embodiments of the inventive concepts.
Figure 17B:
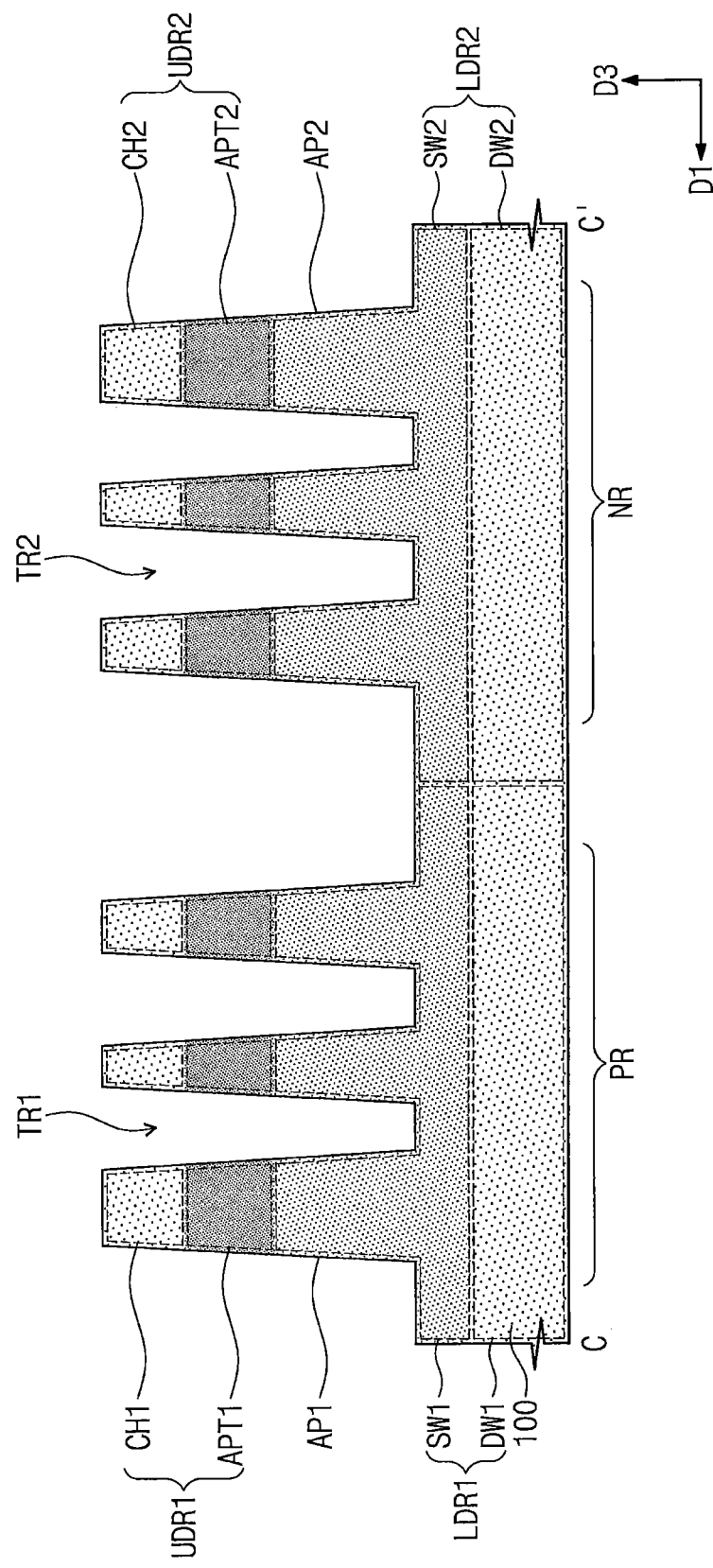

FIGS. 17A and 17B are cross-sectional views illustrating a second comparative example different from the manufacturing method according to some embodiments of the inventive concepts.

Referring to FIG. 17A, the ion implantation processes using the high energy may be performed on the substrate 100 to form the first lower dopant region LDR1 and the second lower dopant region LDR2 in the PMOSFET region PR and the NMOSFET region NR, respectively. The ion implantation processes using the low energy may be performed on the substrate 100 to form a first upper dopant region UDR1 and a second upper dopant region UDR2 in the PMOSFET region PR and the NMOSFET region NR, respectively. An annealing process may be performed after the ion implantation processes using the high energy and the ion implantation processes using the low energy. According to the second comparative example, the ion implantation processes using the high energy and the ion implantation processes using the low energy may be performed on the substrate 100 before the first and second active patterns AP1 and AP2 are formed.

Referring to FIG. 17B, the first and second active patterns AP1 and AP2 may be formed by patterning the substrate 100 having the first and second lower dopant regions LDR1 and LDR2 and the first and second upper dopant regions UDR1 and UDR2. Dopant concentration profiles may not be uniform in the first and second upper dopant regions UDR1 and UDR2. Thus, during the patterning process, the first and second active patterns AP1 and AP2 may be formed such that the first active patterns AP1 have different widths and different shapes and the second active patterns AP2 have different widths and different shapes. In the event that the first and second active patterns AP1 and AP2 have different widths and different shapes, electrical characteristics of a semiconductor device may be deteriorated.

However, in the method for manufacturing the semiconductor device according to the inventive concepts, the ion implantation processes using the high energy may be performed before the formation of the first and second active patterns AP1 and AP2. Thus, it is possible to prevent the stacking faults which may be caused in the first comparative example described above with reference to FIGS. 16A and 16B.

In addition, in the method for manufacturing the semiconductor device according to the inventive concepts, the ion implantation processes using the low energy may be performed after the formation of the first and second active patterns AP1 and AP2. Thus, it is possible to prevent the problem that the first and second active patterns AP1 and AP2 have different widths and different shapes in the second comparative example described above with reference to FIGS. 17A and 17B.

Figure 7:
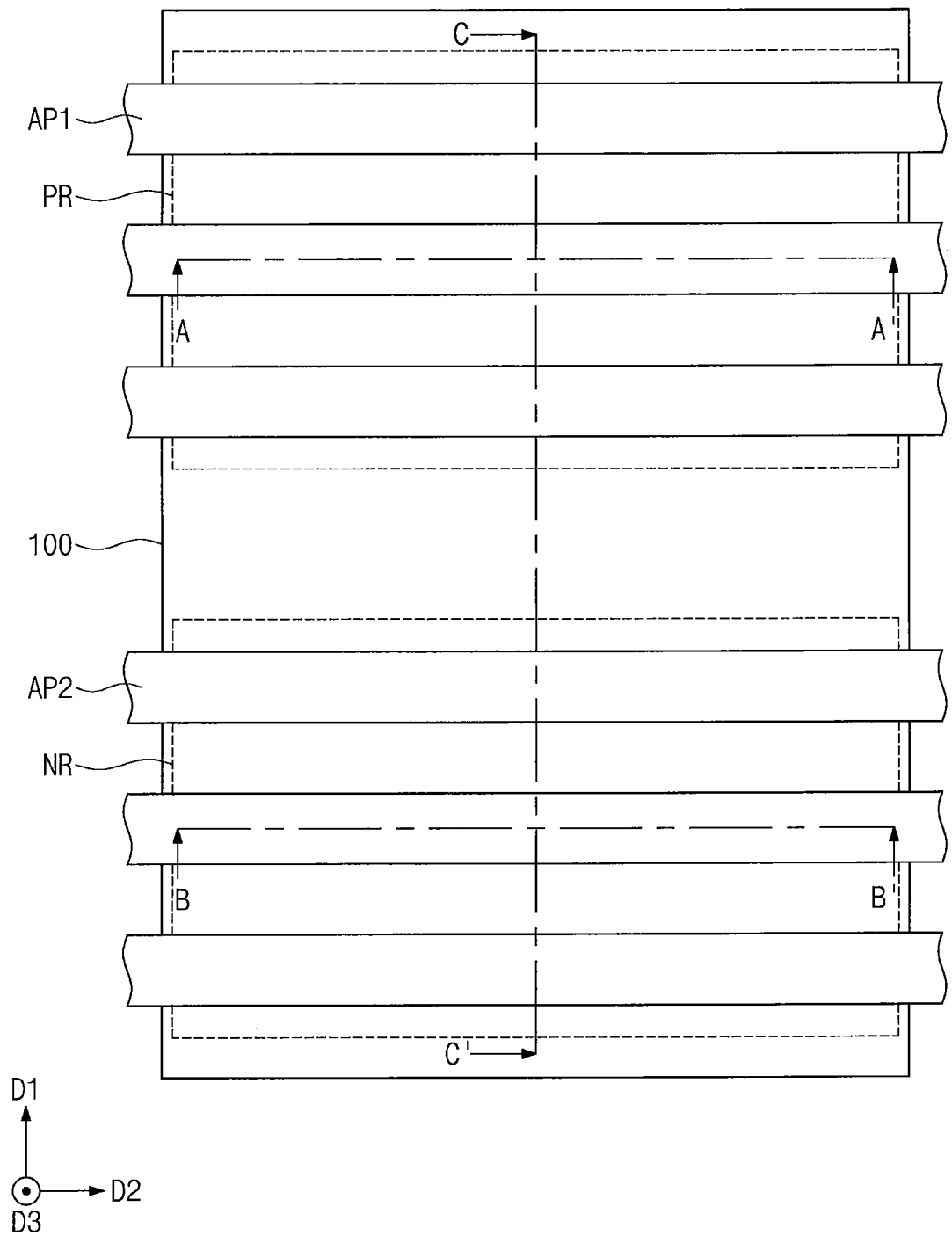
Figure 18A:
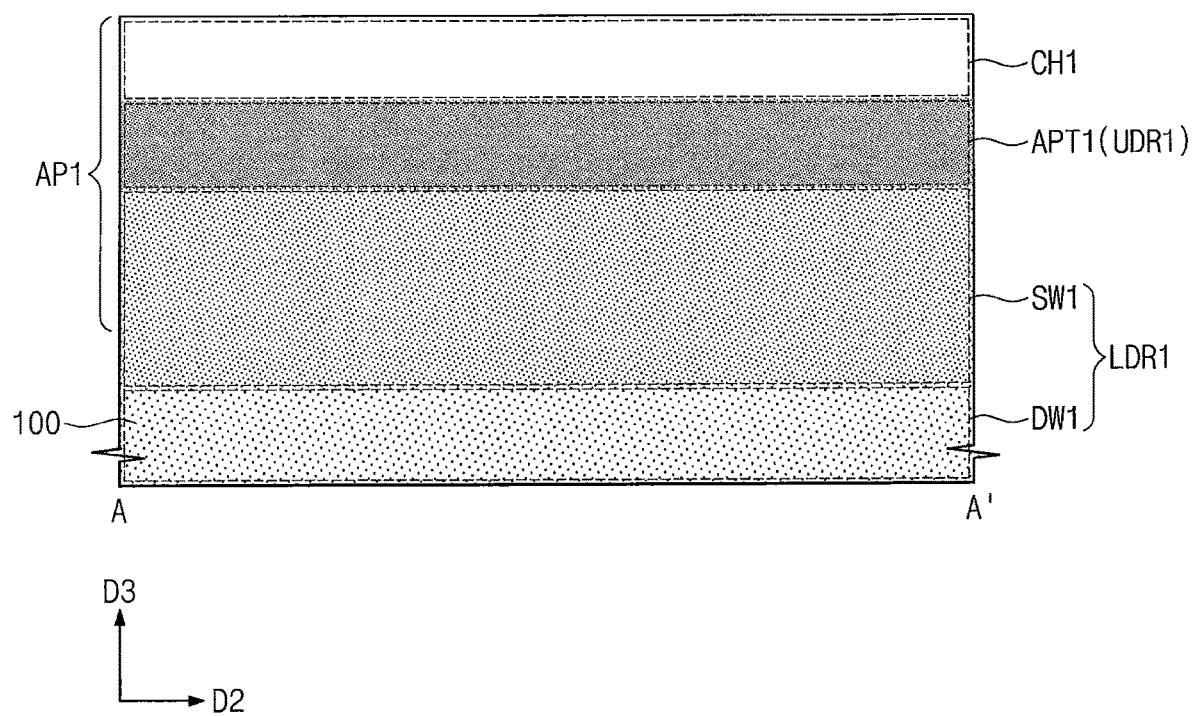
FIGS. 18A, 18B and 18C are cross-sectional views taken along lines A-A', B-B' and C-C' of FIG. 7, respectively, to illustrate a method for manufacturing a semiconductor device according to some embodiments of the inventive concepts.
Figure 18B:
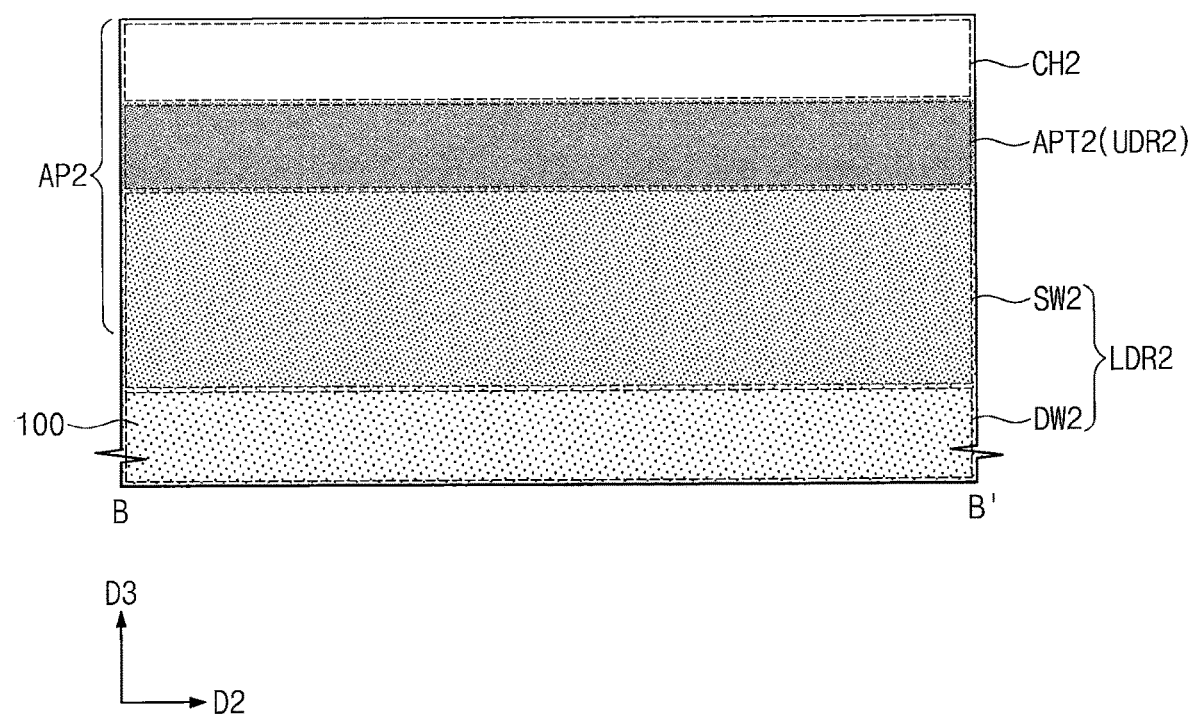
Figure 18C:
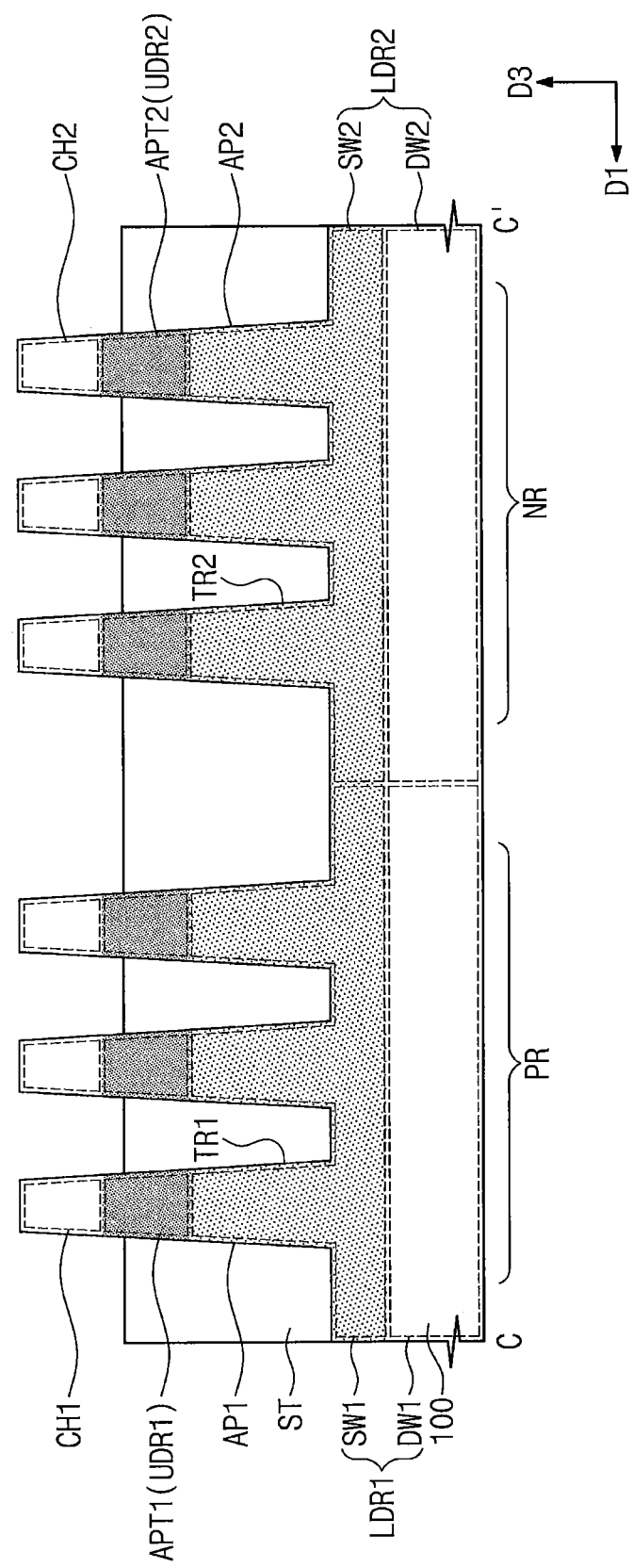

FIGS. 18A, 18B, and 18C are cross-sectional views taken along lines A-A', B-B' and C-C' of FIG. 7, respectively, to illustrate a method for manufacturing a semiconductor device according to some embodiments of the inventive concepts. In the present embodiment, the descriptions to the same technical features as in the embodiments of FIGS. 3 to 14D will be omitted for the purpose of ease and convenience in explanation. In other words, differences between the present embodiment and the embodiments of FIGS. 3 to 14D will be mainly described hereinafter.

Referring to FIGS. 7 and 18A to 18C, a device isolation layer ST may be formed in the first and second trenches TR1 and TR2 of the resultant structure of FIGS. 5 and 6A to 6C. Ion implantation processes using low energy may be performed on the first and second active patterns AP1 and AP2 to form a first upper dopant region UDR1 and a second upper dopant region UDR2 in the first and second active patterns AP1 and AP2, respectively (S300 of FIG. 15).

The formation of the first upper dopant region UDR1 may include forming a first anti-punch through region APT1 in an upper portion of each of the first active patterns AP1. The formation of the second upper dopant region UDR2 may include forming a second anti-punch through region APT2 in an upper portion of each of the second active patterns AP2. An annealing process may be performed after the ion implantation processes using the low energy.

Unlike the above descriptions with reference to FIGS. 7 and 8A to 8C, the sixth ion implantation process for forming the first channel region CH1 doped with the dopants and the eighth ion implantation process for forming the second channel region CH2 doped with the dopants may be omitted in the present embodiment.

First and second channel regions CH1 and CH2 may be defined on the first and second anti-punch through regions APT1 and APT2, respectively. The first channel region CH1 may include dopants diffused from the first anti-punch through region APT1, and the second channel region CH2 may include dopants diffused from the second anti-punch through region APT2. A dopant concentration of each of the first and second channel regions CH1 and CH2 according to the present embodiment may be lower than that of each of the first and second channel regions CH1 and CH2 described above with reference to FIGS. 7 and 8A to 8C.

Subsequent processes may be substantially the same as described above with reference to FIGS. 9 to 14D.

Figure 3:
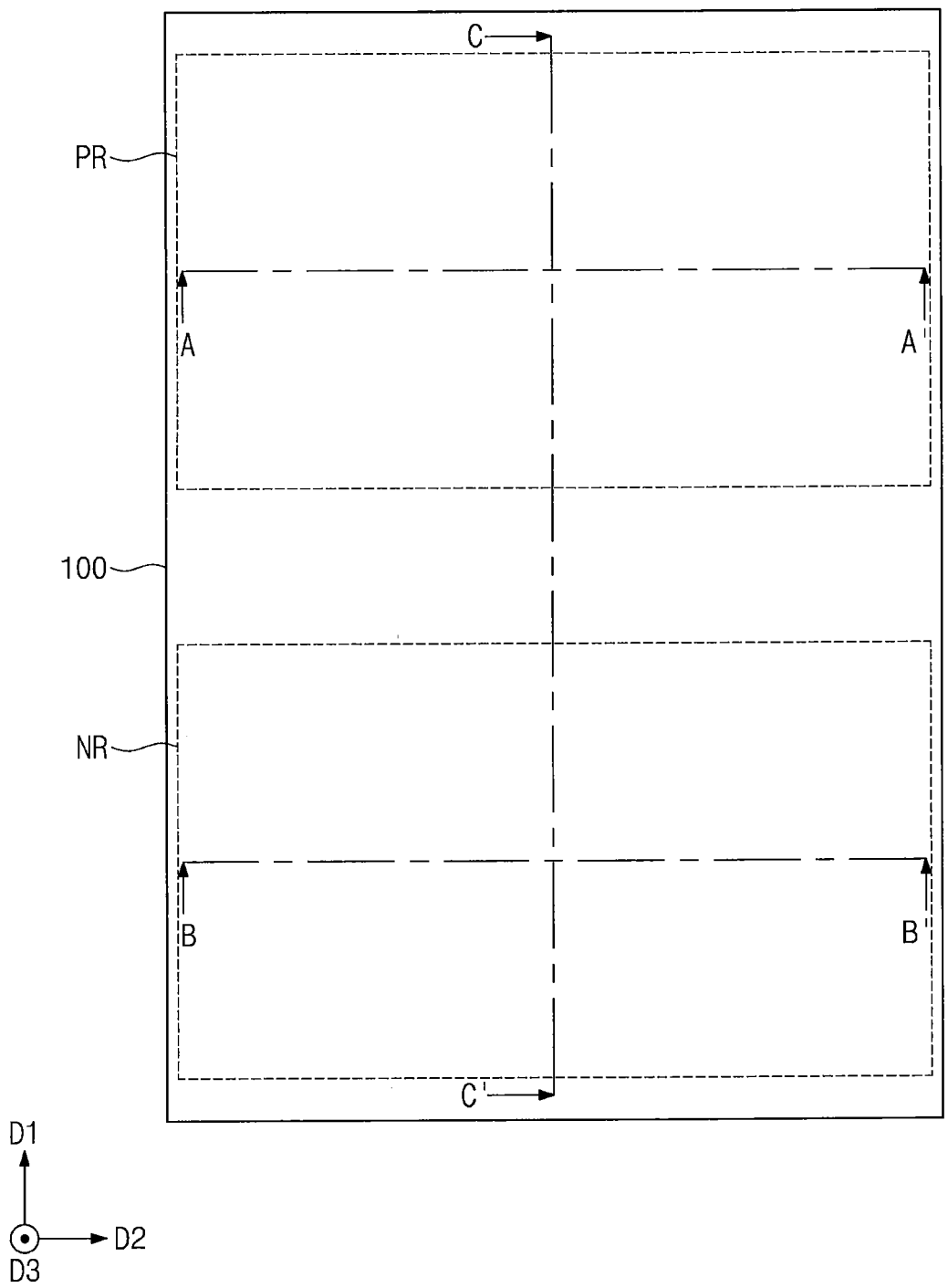
FIGS. 3, 5, 7, 9, 11 and 13 are plan views illustrating a method for manufacturing a semiconductor device according to some embodiments of the inventive concepts.
Figure 4A:
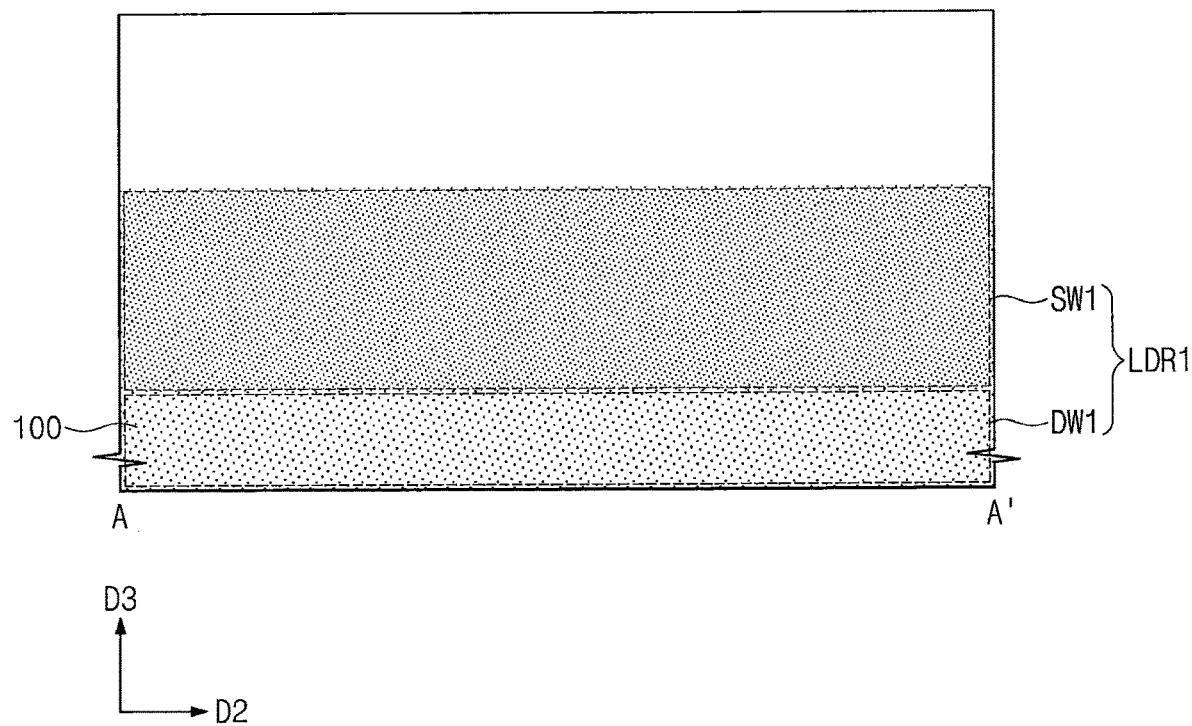
FIGS. 4A, 6A, 8A, 10A, 12A and 14A are cross-sectional views taken along lines A-A' of FIGS. 3, 5, 7, 9, 11 and 13, respectively.
Figure 4B:
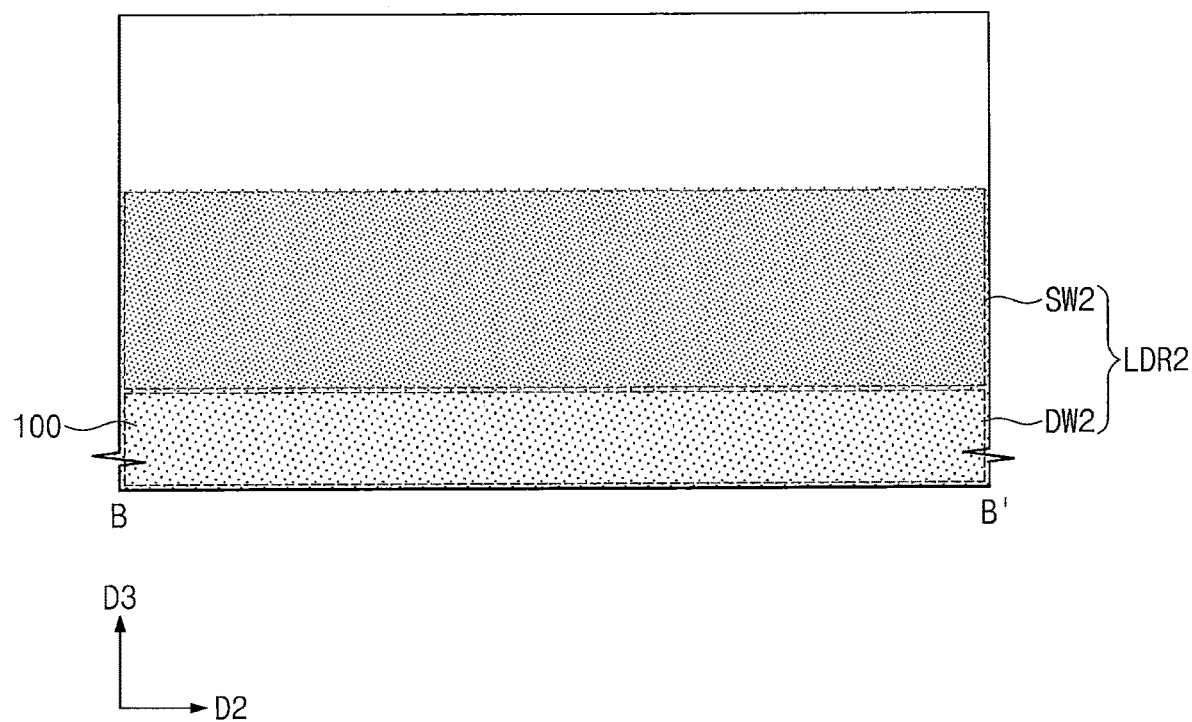
FIGS. 4B, 6B, 8B, 10B, 12B and 14B are cross-sectional views taken along lines B-B' of FIGS. 3, 5, 7, 9, 11 and 13, respectively.
Figure 4C:
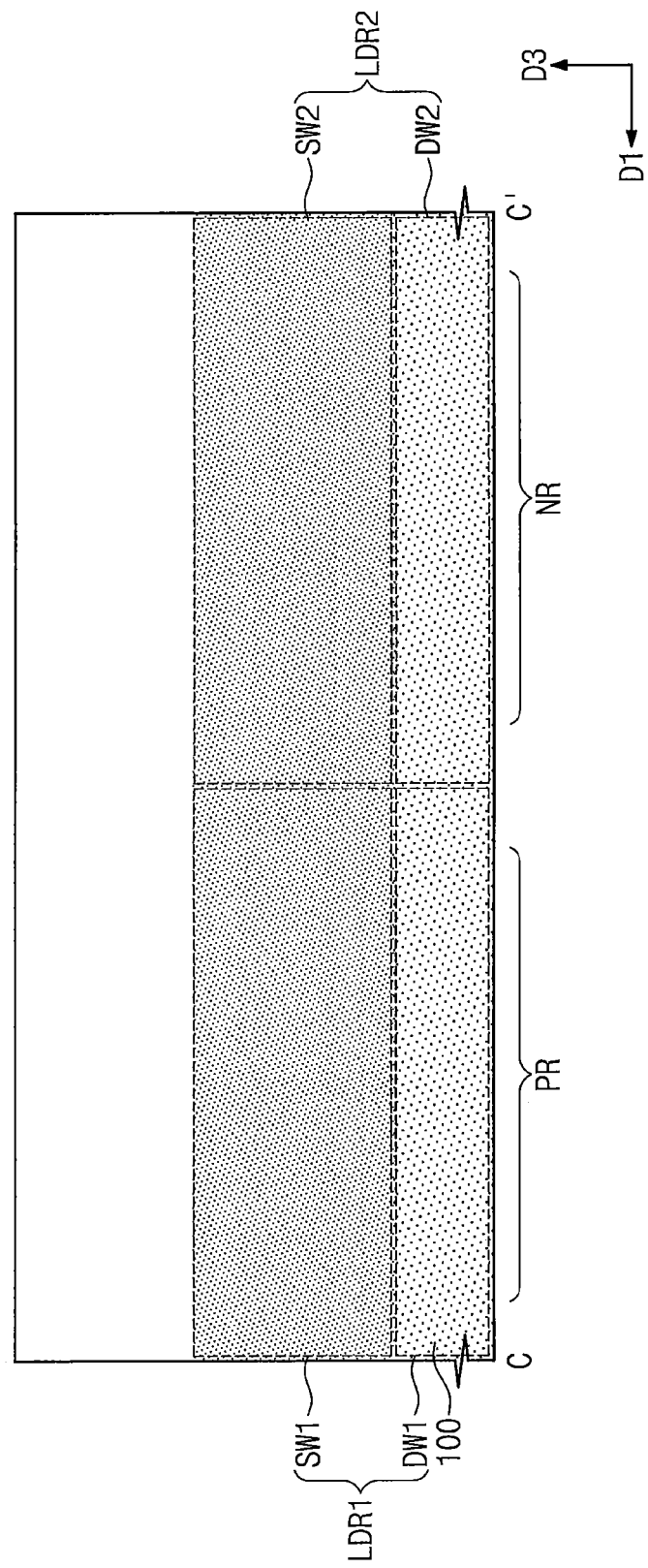
FIGS. 4C, 6C, 8C, 10C, 12C and 14C are cross-sectional views taken along lines C-C' of FIGS. 3, 5, 7, 9, 11 and 13, respectively.
Figure 5:
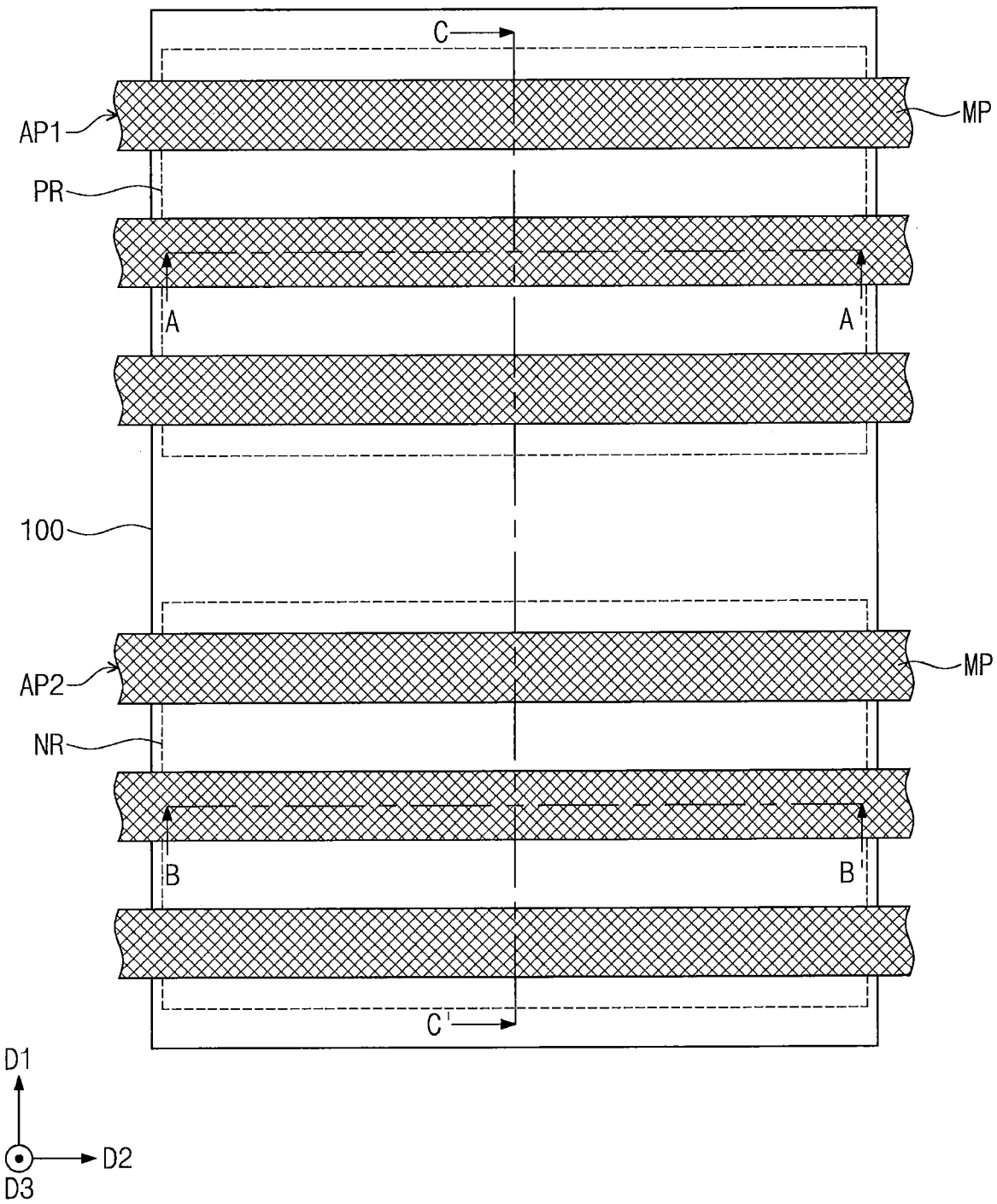
Figure 6A:
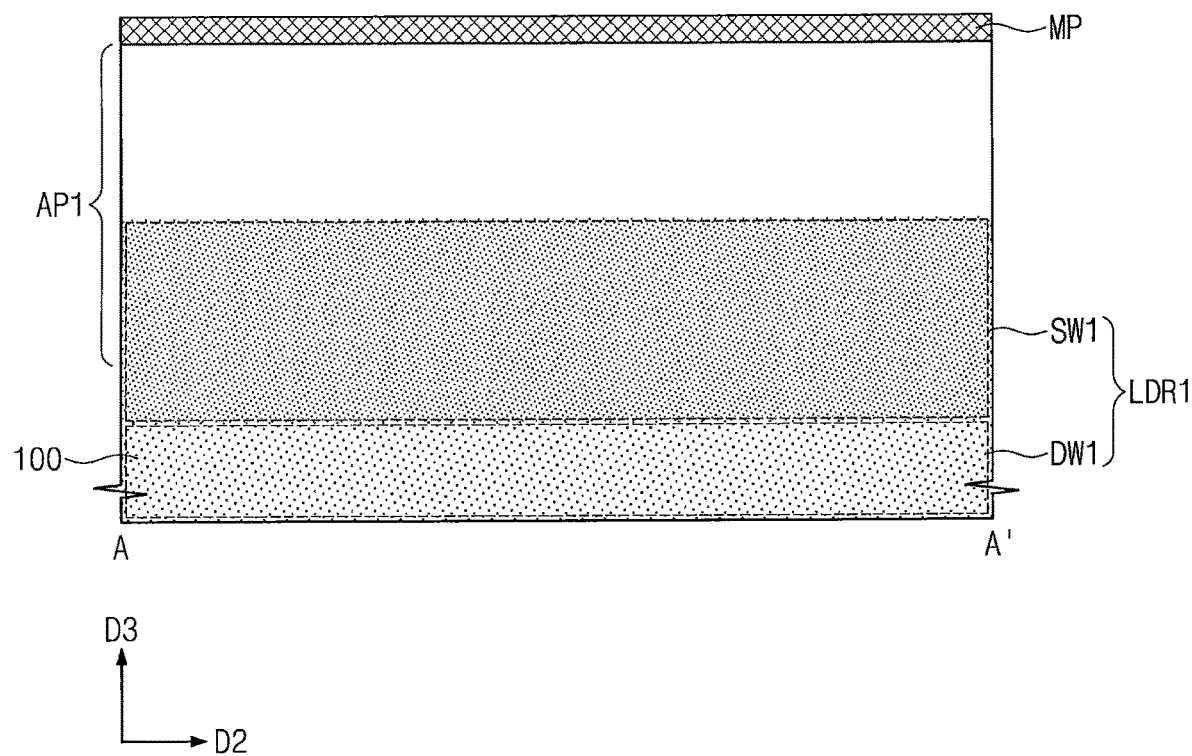
Figure 6B:
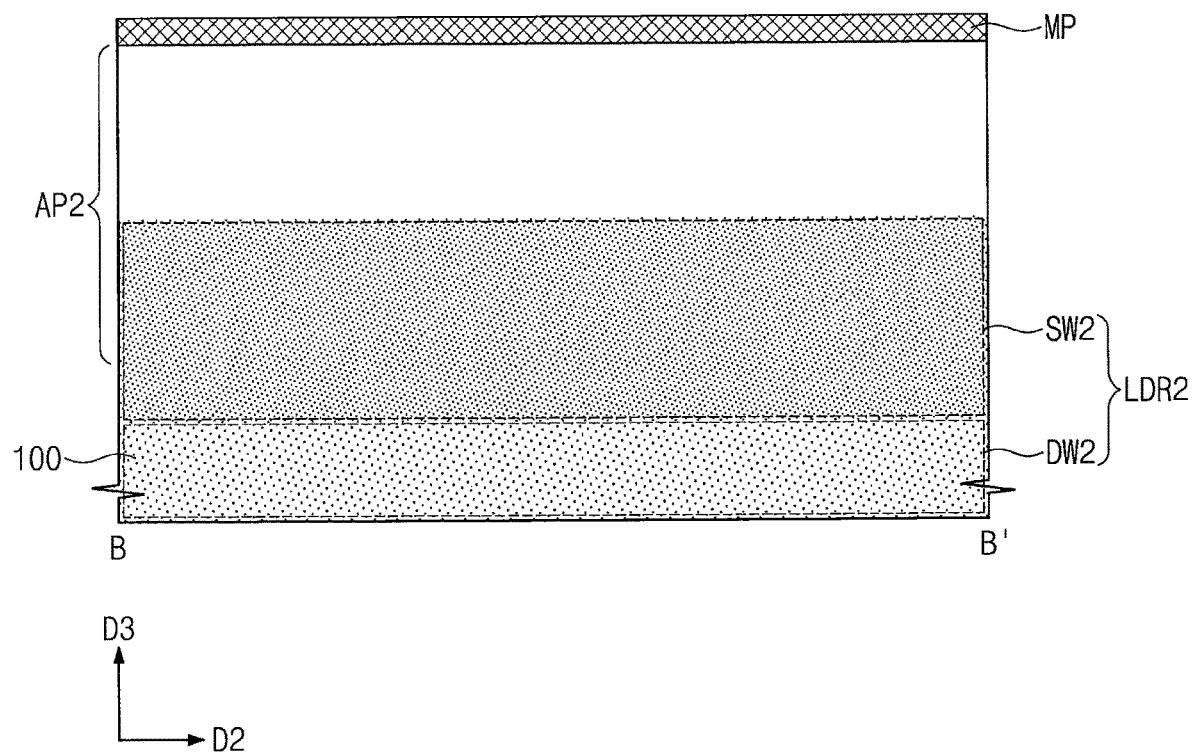
Figure 6C:
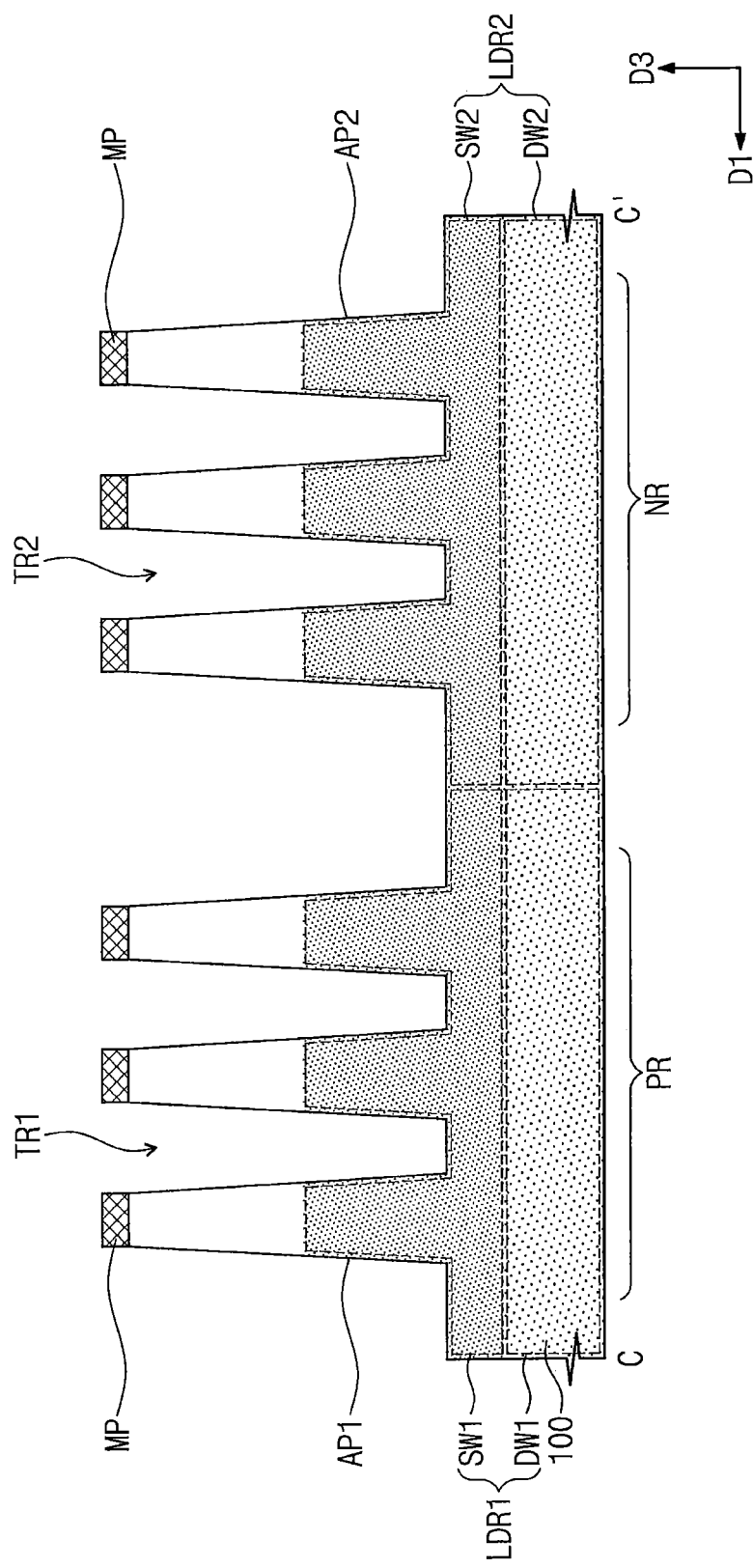
Figure 19A:
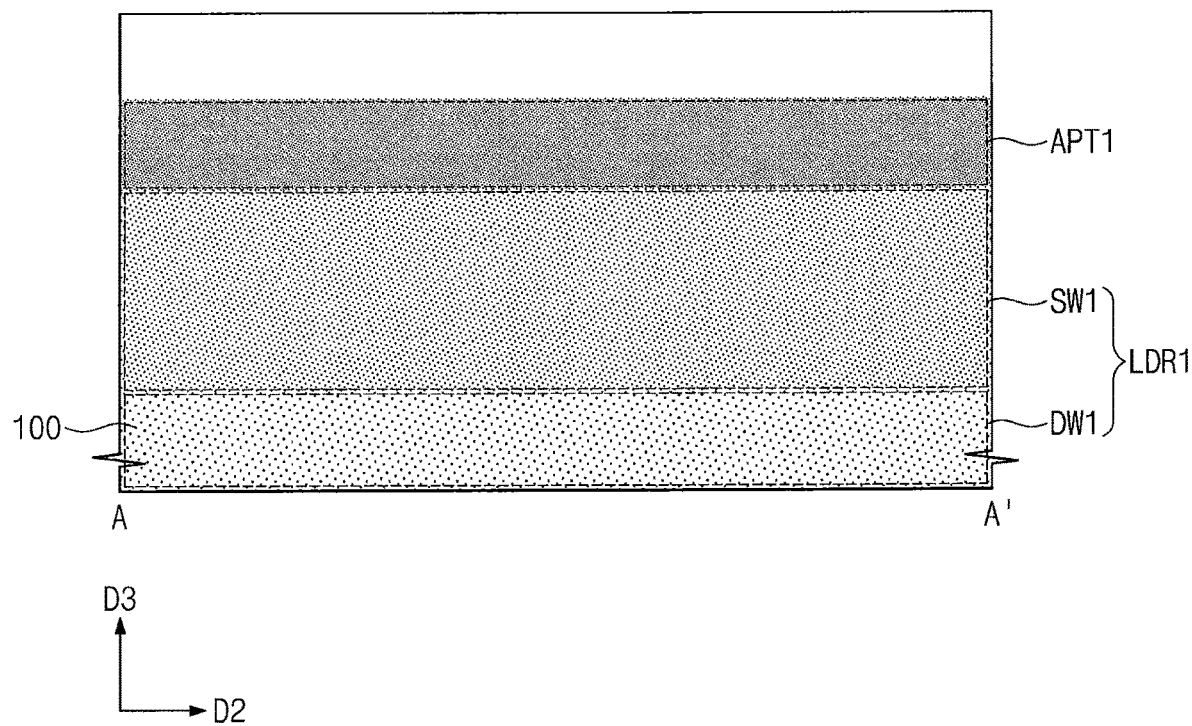
FIGS. 19A, 19B and 19C are cross-sectional views taken along lines A-A', B-B' and C-C' of FIG. 3, respectively, to illustrate a method for manufacturing a semiconductor device according to some embodiments of the inventive concepts.
Figure 19B:
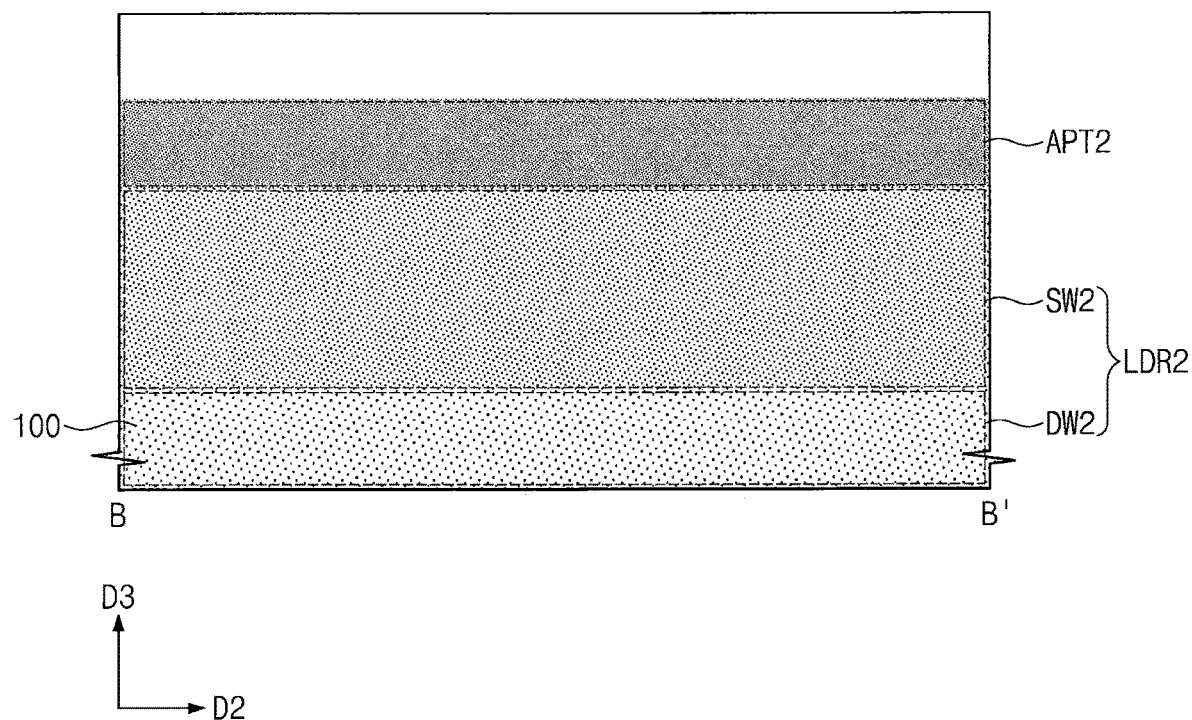
Figure 19C:
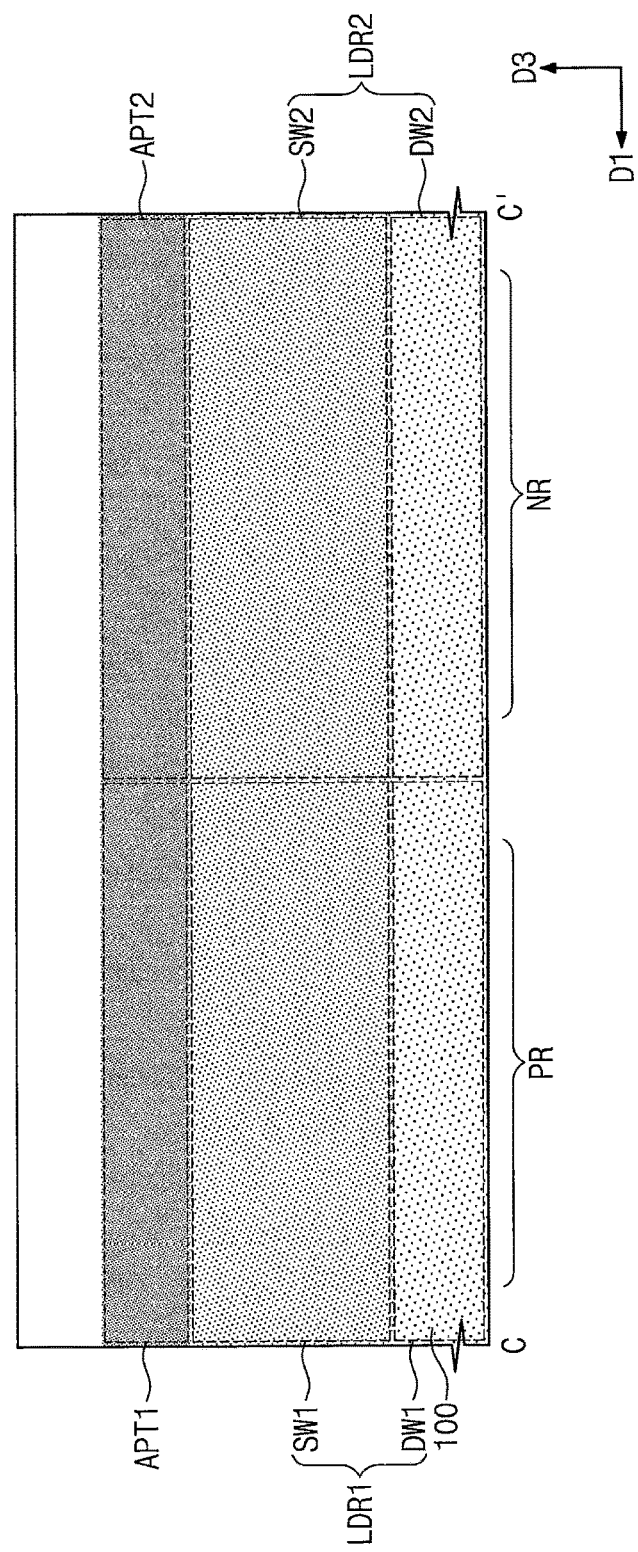

FIGS. 19A, 19B, and 19C are cross-sectional views taken along lines A-A', B-B' and C-C' of FIG. 3, respectively, to illustrate a method for manufacturing a semiconductor device according to some embodiments of the inventive concepts. In the present embodiment, the descriptions to the same technical features as in the embodiments of FIGS. 3 to 14D will be omitted for the purpose of ease and convenience in explanation. In other words, differences between the present embodiment and the embodiments of FIGS. 3 to 14D will be mainly described hereinafter.

Referring to FIGS. 3 and 19A to 19C, the ion implantation processes using the high energy may be performed on the substrate 100 to form the first lower dopant region LDR1 and the second lower dopant region LDR2 in the PMOSFET region PR and the NMOSFET region NR, respectively. Additionally, ion implantation processes may be performed on the substrate 100 to form a first anti-punch through region APT1 and a second anti-punch through region APT2 in the PMOSFET region PR and the NMOSFET region NR, respectively. The ion implantation processes for forming the first and second anti-punch through regions APT1 and APT2 may be performed at lower powers than the ion implantation processes using the high energy.

Figure 8A:
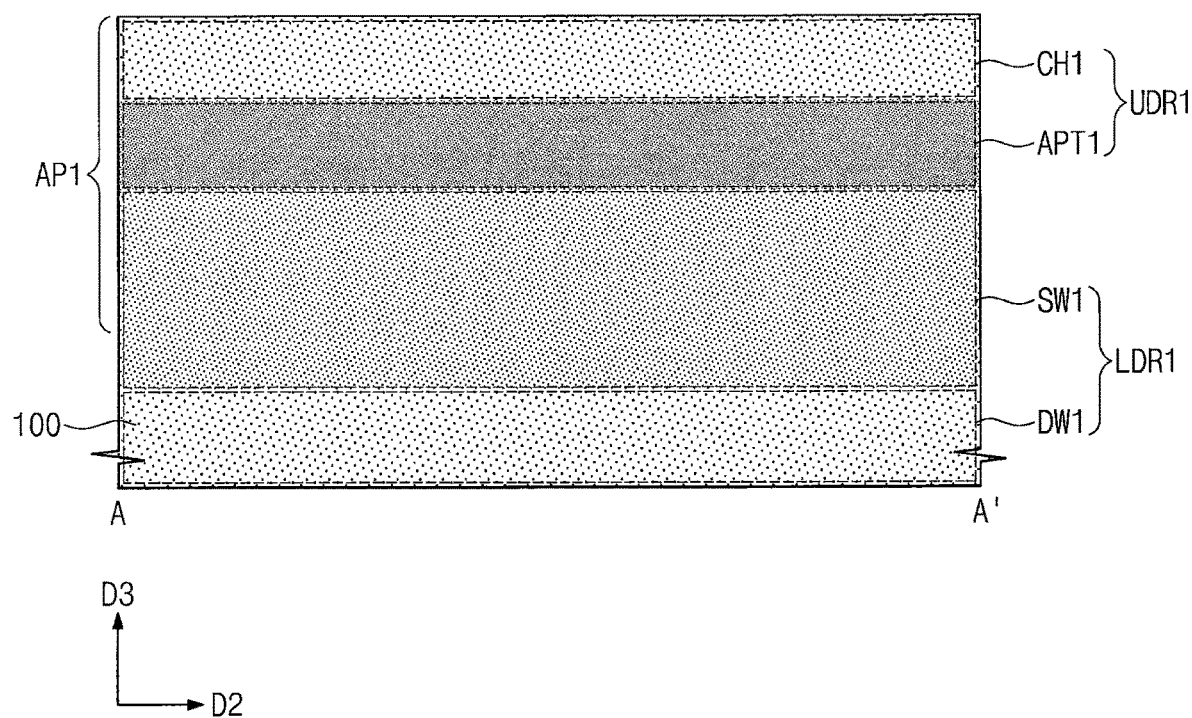
Figure 8B:
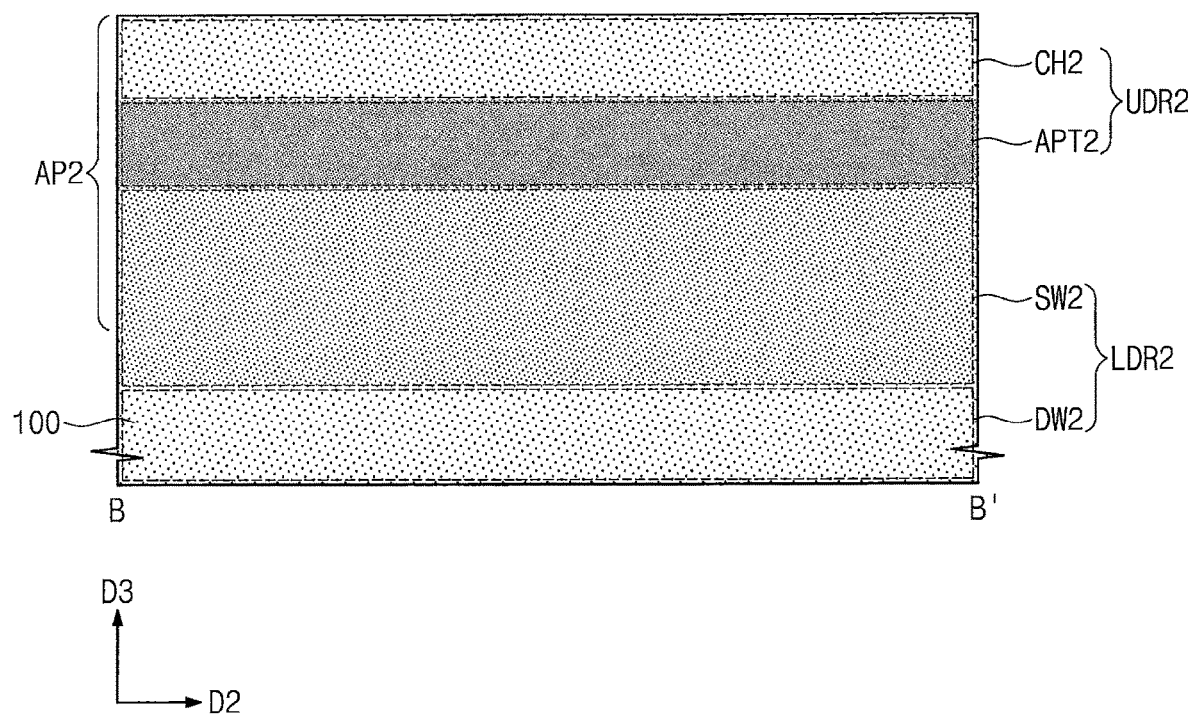
Figure 8C:
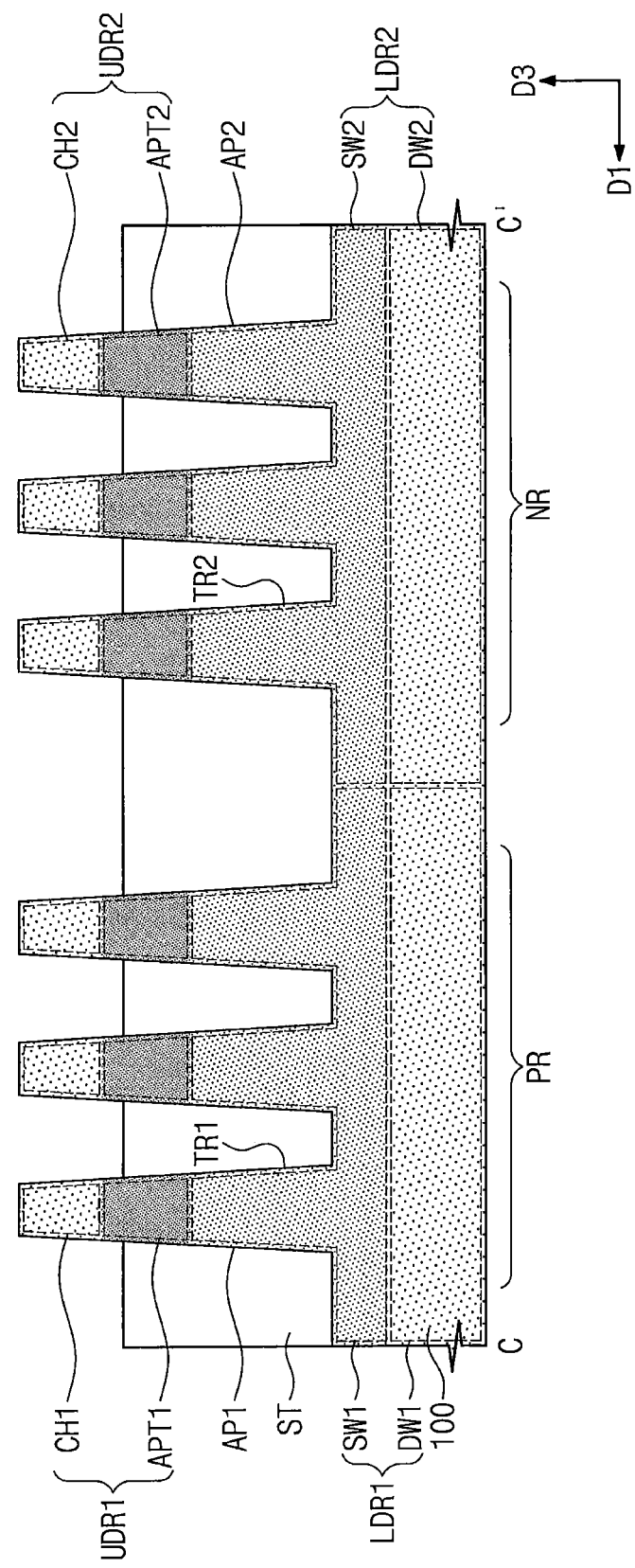
Figure 9:
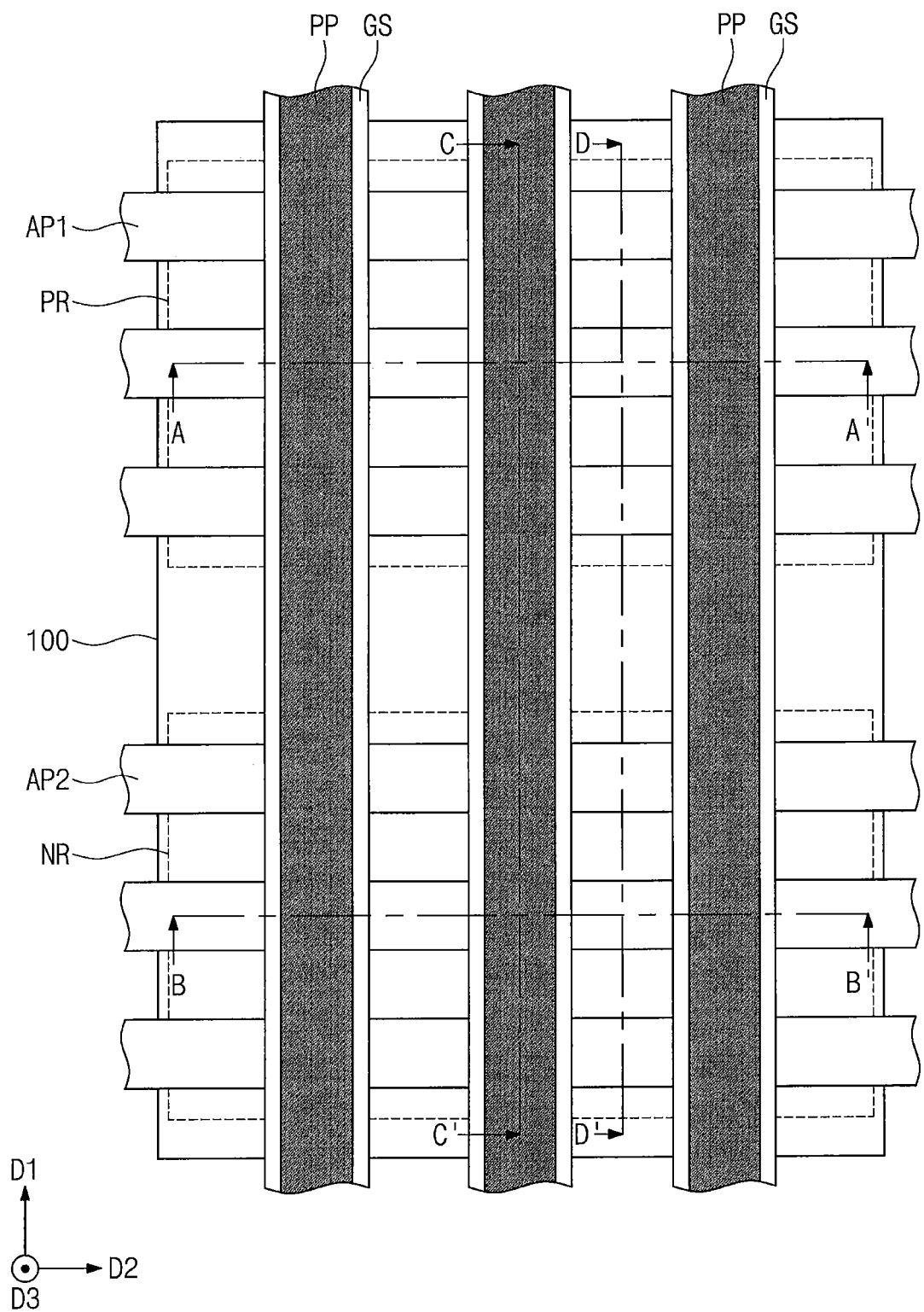

Subsequent processes may be substantially the same as described above with reference to FIGS. 5 to 14D, with the exception of the description of the formation of the first anti-punch through region APT1 and the second anti-punch through region APT2 described with respect to FIGS. 7 and 8A to 8C. In other words, in the embodiment illustrated in FIGS. 19A to 19C, the first anti-punch through region APT1 and the second anti-punch through region APT2 may be formed prior to the formation of the first and second active patterns AP1 and AP2. After the formation of the first and second active patterns AP1 and AP2, the ion implantation processes using the low energy may be performed to form the first channel region CH1 and the second channel region CH2.

The methods for manufacturing the semiconductor devices according to the inventive concepts may prevent and/or reduce the stacking fault from being caused in the active patterns and may prevent and/or reduce the problem that widths and shapes of the active patterns are different from each other. Thus, the electrical characteristics of the semiconductor device may be improved.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method for manufacturing a semiconductor device, the method comprising:
   performing a first ion implantation process on a substrate to form a lower dopant region in the substrate;
   patterning the substrate having the lower dopant region to form active patterns; and
   performing a second ion implantation process on the active patterns to form an upper dopant region in an upper portion of each of the active patterns,
   wherein the lower dopant region and the upper dopant region have a same conductivity type, and
   wherein a concentration of dopants of the upper dopant region is higher than a concentration of dopants of the lower dopant region.

2. The method of claim 1, wherein the first ion implantation process is performed at a higher power than the second ion implantation process.

3. The method of claim 1, further comprising:
   forming, a source/drain pattern in an upper portion of respective ones of the active patterns,
   wherein a conductivity type of the source/drain pattern is different front the conductivity type of the upper dopant region.

4. The method of claim 1, wherein a bottom surface of a trench between a pair of adjacent ones of the active patterns is located at a level between a top surface and a bottom surface of the lower dopant region.

5. The method of claim 1, wherein the upper dopant region vertically overlaps with the lower dopant region,
   wherein the upper dopant region comprises a first region and a second region,
   wherein the first region is between the second region and the lower dopant region, and
   wherein the second region has a lower concentration of dopants than the first region.

6. The method of claim 1, further comprising:
   forming a device isolation layer in trenches between the active patterns,
   wherein upper portions of the active patterns vertically protrude from the device isolation layer.

7. The method of claim 1, further comprising:
   performing a first annealing process after the performing of the first ion implantation process; and
   performing, a second annealing process after the performing of the second ion implantation process.

8. The method, of claim 1, wherein the performing of the second ion implantation process to form the upper dopant region comprises forming an anti-punch through region.

9. The method of claim 1, further comprising:
   forming a sacrificial pattern intersecting, the active patterns; and
   replacing the sacrificial pattern with a gate electrode.

10. A method for manufacturing a semiconductor device, the method comprising:
    performing a first ion implantation process on a substrate to form a lower dopant region;
    forming mask patterns on the substrate;
    etching the substrate using the mask patterns as etch masks to form trenches;
    forming a device isolation layer in the trenches;
    performing a second ion implantation process on the substrate to form an upper dopant region; and
    forming a gate electrode on a portion of the upper dopant region,
    wherein the first ion implantation process is performed at a higher power than the second ion implantation process.

11. The method of claim 10,
    wherein the upper dopant region is formed on the lower dopant region, and
    wherein the lower dopant region and the upper dopant region have a same conductivity type.

12. The method of claim 10, wherein a dopant ion dose of the first ion implantation process is lower than a dopant ion dose of the second ion implantation process.

13. The method of claim 10, further comprising:
    performing a first annealing process after the performing of the first ion implantation process; and
    performing a second annealing process after the performing of the second ion implantation process.

14. The method of claim 10, further comprising:
    forming a source/drain pattern in an upper portion of the substrate after the performing of the second ion implantation process.

15. A method for manufacturing a semiconductor device, the method comprising:
    forming a first lower dopant region in a first region of a substrate;
    patterning the first region having the first lower dopant region to form first active patterns;
    forming a first upper dopant region in an upper portion of respective ones of the first active patterns; and
    forming a first source/drain pattern in the upper portion of the respective ones of the first active patterns,
    wherein a conductivity type of the first source/drain pattern is different from a conductivity type of the first upper dopant region.

16. The method of claim 15, wherein the first lower dopant region and the first upper dopant region have a same conductivity type.

17. The method of claim 15, wherein a concentration of dopants of the first upper dopant region is higher than a concentration of dopants of the first lower dopant region.

18. The method of claim 15, further comprising:
forming a second lower dopant region in a second region of the substrate;
patterning the second region having the second lower dopant region to form second active patterns; and
forming a second upper dopant region in an upper portion of each of the second active patterns,
wherein the first active patterns and the second active patterns are formed at the same time.

19. The method of claim 18, wherein the conductivity type of the first upper dopant region is different from a conductivity type of the second upper dopant region.

20. The method of claim 10, wherein the portion of the upper dopant region on which the gate electrode is formed comprises a channel region between two source/drain patterns.

* * * * *